United States Patent
Suwa et al.

(10) Patent No.: US 6,625,050 B2
(45) Date of Patent: Sep. 23, 2003

(54) SEMICONDUCTOR MEMORY DEVICE ADAPTABLE TO VARIOUS TYPES OF PACKAGES

(75) Inventors: Makoto Suwa, Hyogo (JP); Shinichi Jinbo, Hyogo (JP); Zengcheng Tian, Hyogo (JP); Takeo Okamoto, Hyogo (JP); Kozo Ishida, Hyogo (JP); Hideki Yonetani, Hyogo (JP); Tsutomu Nagasawa, Hyogo (JP); Tadaaki Yamauchi, Hyogo (JP); Junko Matsumoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/143,931

(22) Filed: May 14, 2002

(65) Prior Publication Data

US 2003/0081443 A1 May 1, 2003

(30) Foreign Application Priority Data

Oct. 29, 2001 (JP) ........................ 2001-331137

(51) Int. Cl.[7] ................................. G11C 5/06
(52) U.S. Cl. ....................... 365/63; 365/51; 365/189.08
(58) Field of Search ....................... 365/51, 63, 230.03, 365/226, 205, 207, 189.08, 189.11

(56) References Cited

U.S. PATENT DOCUMENTS 6,147,924 A * 11/2000 Lee et al. ............... 365/230.03
6,150,728 A * 11/2000 Tsukude et al. ............. 257/786
6,512,715 B2 * 1/2003 Okamoto et al. ........... 365/227

FOREIGN PATENT DOCUMENTS

| JP | 3-149867 | 6/1991 |
| JP | 7-45795 | 2/1995 |
| JP | 7-211869 | 8/1995 |
| JP | 10-275472 | 10/1998 |
| JP | 2000-208716 | 7/2000 |

* cited by examiner

Primary Examiner—Son T. Dinh
Assistant Examiner—Hien Nguyen
(74) Attorney, Agent, or Firm—McDermott, Will & Emery

(57) ABSTRACT

Pad lines are placed on the peripheral region of a chip along EAST band and WEST band (E/W band). In order to allow the chip with pads arranged on the peripheral region to be adaptable to a TSOP, VDD and VSS pads are arranged on the edge region on NORTH band and SOUTH band (N/S band) near the center of the N/S band. Moreover, in consideration of frame design for the TSOP, some pads on the ends of the pad lines among the pads included in the pad lines are arranged in reverse order relative to the order of pins. Further, VDDQ and VSSQ pads are arranged in the same order as that of pins for a package which requires no consideration of frame design. On the other hand, for use in a BGA package, VDD and VSS pads are arranged in pairs at respective ends of the pad lines. A semiconductor memory device with this pad arrangement is accordingly adaptable to various types of packages.

20 Claims, 26 Drawing Sheets

NORTH BAND

NORTH BAND

FIG. 28  PRIOR ART

| Left | Pin | | Pin | Right |
|---|---|---|---|---|
| VDD | 1 | | 86 | VSS |
| DQ0 | 2 | | 85 | DQ15 |
| VDDQ | 3 | | 84 | VSSQ |
| DQ1 | 4 | 13A | 83 | DQ14 |
| DQ2 | 5 | | 82 | DQ13 |
| VSSQ | 6 | | 81 | VDDQ |
| DQ3 | 7 | | 80 | DQ12 |
| DQ4 | 8 | | 79 | DQ11 |
| VDDQ | 9 | | 78 | VSSQ |
| DQ5 | 10 | | 77 | DQ10 |
| DQ6 | 11 | | 76 | DQ9 |
| VSSQ | 12 | | 75 | VDDQ |
| DQ7 | 13 | | 74 | DQ8 |
| NC | 14 | | 73 | NC |
| VDD | 15 | | 72 | VSS |
| DQM0 | 16 | | 71 | DQM1 |
| WE | 17 | | 70 | NC |
| CAS | 18 | | 69 | NC |
| RAS | 19 | | 68 | CLK |
| CS | 20 | | 67 | CKE |
| NC | 21 | | 66 | A9 |
| BA0 | 22 | | 65 | A8 |
| BA1 | 23 | | 64 | A7 |
| A10 | 24 | | 63 | A6 |
| A0 | 25 | | 62 | A5 |
| A1 | 26 | | 61 | A4 |
| A2 | 27 | | 60 | A3 |
| DQM2 | 28 | | 59 | DQM3 |
| VDD | 29 | | 58 | VSS |
| NC | 30 | | 57 | NC |
| DQ16 | 31 | | 56 | DQ31 |
| VSSQ | 32 | | 55 | VDDQ |
| DQ17 | 33 | | 54 | DQ30 |
| DQ18 | 34 | | 53 | DQ29 |
| VDDQ | 35 | | 52 | VSSQ |
| DQ19 | 36 | | 51 | DQ28 |
| DQ20 | 37 | | 50 | DQ27 |
| VSSQ | 38 | | 49 | VDDQ |
| DQ21 | 39 | | 48 | DQ26 |
| DQ22 | 40 | | 47 | DQ25 |
| VDDQ | 41 | | 46 | VSSQ |
| DQ23 | 42 | | 45 | DQ24 |
| VDD | 43 | | 44 | VSS |

FIG. 29 PRIOR ART

| | | |
|---|---|---|
| VDD | □ □ | VSS |
| DQ0 | □ □ | DQ15 |
| VDDQ | □ □ | VSSQ |
| DQ1 | □ □ | DQ14 |
| DQ2 | □ □ | DQ13 |
| VSSQ | □ □ | VDDQ |
| DQ3 | □ □ | DQ12 |
| DQ4 | □ □ | DQ11 |
| VDDQ | □ □ | VSSQ |
| DQ5 | □ □ | DQ10 |
| DQ6 | □ □ | DQ9 |
| VSSQ | □ □ | VDDQ |
| DQ7 | □ □ | DQ8 |
| VDD | □ □ | VSS |
| DQM0 | □ □ | DQM1 |
| WE | □ | |
| CAS | □ □ | CLK |
| RAS | □ □ | CKE |
| CS | □ □ | A9 |
| BA0 | □ □ | A8 |
| BA1 | □ □ | A7 |
| A10 | □ □ | A6 |
| A0 | □ □ | A5 |
| A1 | □ □ | A4 |
| A2 | □ □ | A3 |
| DQM2 | □ □ | DQM3 |
| VDD | □ □ | VSS |
| DQ16 | □ □ | DQ31 |
| VSSQ | □ □ | VDDQ |
| DQ17 | □ □ | DQ30 |
| DQ18 | □ □ | DQ29 |
| VDDQ | □ □ | VSSQ |
| DQ19 | □ □ | DQ28 |
| DQ20 | □ □ | DQ27 |
| VSSQ | □ □ | VDDQ |
| DQ21 | □ □ | DQ26 |
| DQ22 | □ □ | DQ25 |
| VDDQ | □ □ | VSSQ |
| DQ23 | □ □ | DQ24 |
| VDD | □ □ | VSS |

SEMICONDUCTOR MEMORY DEVICE ADAPTABLE TO VARIOUS TYPES OF PACKAGES

BACKGROUND OF THE INVENTION

1. Field of the Invention

The present invention relates to semiconductor memory devices. In particular, the invention relates to a semiconductor memory device having a pad arrangement, a circuit arrangement and a circuit structure adaptable to various types of packages.

2. Description of the Background Art

In recent years, semiconductor memory devices have been increasing in capacity and decreasing in package size for achieving a higher packaging density. BGA (Ball Grid Array) package and MCP (Multi Chip Package) are examples of such small-sized packages.

For a BGA-packaged semiconductor memory device, bonding pads are arranged on the peripheral region in consideration of the structure of BGA. For a MCP semiconductor memory device, bonding pads are also arranged on the peripheral region for stacking semiconductor chips on each other.

On the other hand, for a TSOP (Thin Small-Outline Package) semiconductor memory device, bonding pads are arranged on the central region in an LOC (Lead On Chip) structure since the TSOP uses a leadframe and thus it is difficult to design the leadframe if the pads are arranged on the peripheral region.

FIG. 28 shows an arrangement of pins of a TSOP for a DRAM (Dynamic Random Access Memory) with the ×32-bit configuration. The pins include power supply-related pins (denoted by VDD, VSS, VDDQ and VSSQ), data pins (denoted by DQi), address pins (denoted by Ai) and control signal pins (denoted by CLK, CKE, AE, RAS, CAS, CS and the like), and these pins are arranged along the two sides. Here, reference character 13A is shown that is described later.

FIG. 29 shows a corresponding conventional arrangement of pads of a DRAM with ×32-bit configuration adapted for the TSOP shown in FIG. 28. This DRAM adapted for the TSOP has pads arranged on the central region in the same order as that of pins of the package.

Different pad arrangements have been used for conventional semiconductor memory devices depending on the packaging type of the semiconductor devices. This is undesirable in terms of reduction in production cost and adaptation to various types of products.

Here, a semiconductor memory device is considered from its word structure. If the semiconductor memory device has a ×32-bit configuration which results in a high pin count and its TSOP of the ×32-bit configuration is implemented by arranging pads on the periphery, for example, the device size would increase as a whole since there should be left a sufficient space for the leadframe.

On the other hand, a semiconductor memory device of ×16-bit or less accordingly has a lower pin count. In this case, pads are desirably arranged on the periphery if a BGA package or MCP of ×16-bit configuration is employed. In addition, pads are desirably arranged along two sides only if the MCP is employed.

Regarding this issue, the number of pins is defined as "high pin count" or "lower pin count" depending on whether the bit number is 32 or 16. If a further miniaturization is achieved in the future, a similar problem could arise in semiconductor memory devices of ×32-bit configuration and ×64-bit configuration and semiconductor memory devices of a greater number of bits.

Accordingly, as packaging density has been increasing in recent years, semiconductor memory devices should be adaptable to various types of packages and also adaptable to packages of smaller size.

SUMMARY OF THE INVENTION

The present invention is made to solve the problems as described above. One object of the present invention is to provide a semiconductor memory device adaptable to various types of packages.

Another object of the present invention is to provide a semiconductor memory device adaptable to any of different word structures.

Still another object of the present invention is to provide a semiconductor memory device with its package reduced in size while achieving the objects above.

According to one aspect of the present invention, a semiconductor memory device rectangular in shape and adaptable to various types of packages includes a memory element storing externally supplied data and a plurality of bonding pads for conveying power supply, data and a signal to/from the memory element. The bonding pads include a first power supply pad and a first ground pad and other bonding pads except for the first power supply pad and the first ground pad. The first power supply pad and the first ground pad are placed near the center of each of two opposite sides of the semiconductor memory device, and other bonding pads including a second power supply pad and a second ground pad are arranged on a peripheral region along remaining two sides other than the two opposite sides.

Preferably, when the semiconductor memory device is packaged by a TSOP, the first power supply pad is used by being wired to a lead of a leadframe that provides external power supply and the first ground pad is used by being wired to a lead of the leadframe that is grounded. When the semiconductor memory device is packaged by a BGA package or multichip package, the second power supply pad is used by being wired to a lead of the leadframe that provides external power supply and the second ground pad is used by being wired to a lead of the leadframe that is grounded.

Preferably, the semiconductor memory device has its word structure switchable between a first word structure and a second word structure larger than the first word structure. When the semiconductor memory device is used for the first word structure, the second power supply pad and the second ground pad are used by being wired respectively to a lead of a leadframe that provides external power supply and a lead of the leadframe that is grounded. When the semiconductor memory device is used for the second word structure, the first power supply pad and the first ground pad are used by being wired respectively to a lead of the leadframe that provides external power supply and a lead of the leadframe that is grounded.

Preferably, the memory element includes a memory cell array having a plurality of memory cells, an input/output circuit connected to a data input/output pad included in the bonding pads for input/output of data from/to external circuitry, and a data bus for transmitting data between the memory cell array and the input/output circuit. The memory cell array is formed of four banks arranged respectively in four regions of the semiconductor memory device, the four regions corresponding to respective regions generated by dividing the semiconductor memory device along a vertical central line and a horizontal central line. The input/output circuit is placed on the peripheral region along the remaining two sides where a line of the bonding pads is placed. The data bus is placed between the banks and along the remaining two sides. The banks are each connected to the data bus placed on a central region between the banks and extending in parallel with the remaining two sides.

According to another aspect of the present invention, a semiconductor memory device having a switchable internal power supply voltage and a switchable interface voltage includes a first switch signal generating circuit generating a first switch signal for switching the internal power supply voltage, a second switch signal generating circuit generating a second switch signal for switching the interface voltage, an internal power supply generating circuit converting, according to the first switch signal, an external power supply voltage to a predetermined internal power supply voltage and outputting the predetermined internal power supply voltage to an internal power supply node, and an input circuit changing, according to the second switch signal, a threshold of voltage determining a logic level of an external input signal. The first switch signal generating circuit includes a first bonding pad and generates the first switch signal according to whether or not a wire provided with a predetermined potential is connected to the first bonding pad. The second switch signal generating circuit includes a second bonding pad and generates the second switch signal according to whether or not a wire provided with a predetermined potential is connected to the second bonding pad.

As discussed above, the semiconductor memory device according to the present invention has pads arranged on the peripheral region and is adaptable to a TSOP. The semiconductor memory device is thus adaptable to various packages including BGA package and MCP which conventionally require pads to be arranged on the peripheral region.

The arrangement of pads on the peripheral region is adaptable to any of a first word structure and a second word structure larger than the first word structure. Then, the semiconductor memory device is adaptable to a great variety of manners for use.

Moreover, the semiconductor memory device according to the present invention has voltage downconverter circuits arranged on the peripheral region according to the arrangement of pads on the peripheral region, and the voltage downconverter circuits are placed as close as possible to power supply pads. Therefore, without deterioration in power supply characteristics, the semiconductor memory device is adaptable to various packages for pads arranged on the peripheral region.

For the first word structure requiring a lower power consumption than that of the second word structure, the ability of the voltage downconverter circuit is appropriately adjusted so that power savings are possible for the first word structure.

Further, the semiconductor memory device according to the present invention includes a minimum required number of power-on circuits. Therefore, it is possible to start a normal operation of the device as earlier as possible after power is turned on while power savings are accomplished. Moreover, the device size can be reduced since no unnecessary circuit is included.

In addition, the semiconductor memory device according to the present invention has an optimum data bus structure for pads arranged on the peripheral region. Then, the device is adaptable to various packages and deterioration of characteristics due to data transmission delay is avoided.

Equalize circuits are provided at several scattered parts of the data bus so that delay of data being transmitted can be prevented.

Further, the semiconductor memory device according to the present invention has voltage downconverter circuits arranged according to the arrangement of pads on the peripheral region, and thus reduction of the device size is possible.

Additionally, voltage downconverter circuits can be dispersedly arranged on sense amplifier bands so that a further reduction of the device size is possible and external power supply lines can be reinforced.

Moreover, the semiconductor memory device according to the present invention has its operating voltage specification and interface voltage specification each switchable by selection of a bonding option. Therefore, products of different types can be manufactured in an assembly process which facilitates production control.

The voltage specification can be switched not only by the bonding option but also by a fuse. Specifically, the specification can be changed depending on whether or not the fuse is laser-blown. Therefore, even if one of these methods is unavailable, products of different types can surely be manufactured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 28 shows a pin arrangement of a TSOP of a DRAM with ×32-bit configuration.

FIG. 29 shows a conventional pad arrangement for a TSOP of a DRAM with ×32-bit configuration.

DESCRIPTION OF THE PREFERRED EMBODIMENTS

Figure 1:
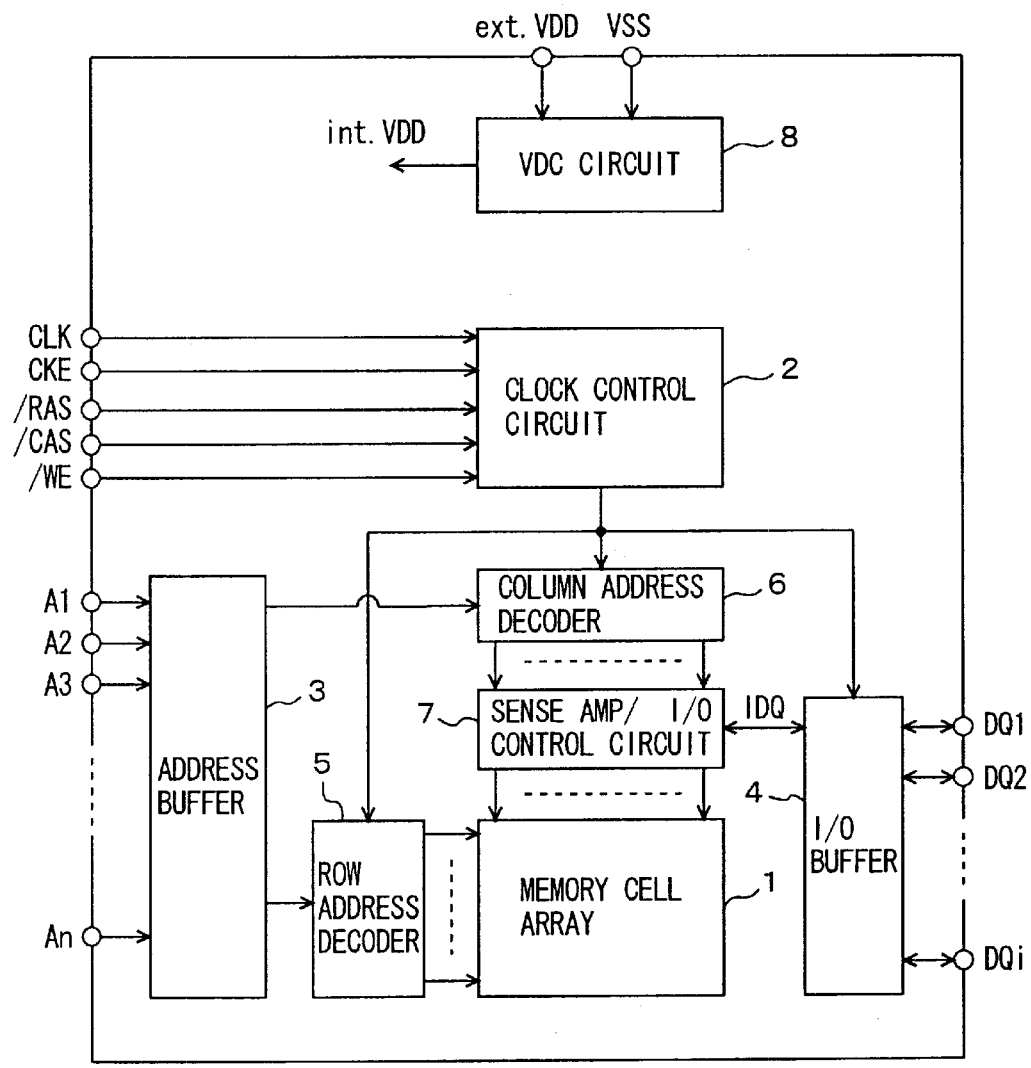
FIG. 1 is a schematic block diagram illustrating a semiconductor memory device in terms of its functions according to the present invention.

Embodiments of the present invention are now described in detail in conjunction with the drawings. The same or corresponding components in the drawings are denoted by the same reference character and description thereof is not repeated here.

FIG. 1 is a schematic block diagram illustrating a semiconductor memory device in terms of its functions according to the present invention.

Referring to FIG. 1, the semiconductor memory device includes a memory cell array 1, a clock control circuit 2, an address buffer 3, an input/output buffer 4, a row address decoder 5, a column address decoder 6, a sense amplifier and an input/output (I/O) control circuit 7, and a voltage down converter circuit 8 (hereinafter referred to as VDC circuit 8).

Memory cell array 1 includes a plurality of memory cells arranged in rows and columns, a plurality of word lines connecting each memory cell to row address decoder 5, and a plurality of bit line pairs connecting each memory cell to sense amplifier and I/O control circuit 7.

Address buffer 3 latches externally supplied address signals A0–An to output an address signal in synchronization with clock signal CLK supplied from clock control circuit 2.

Clock control circuit 2 receives externally supplied signals including clock signal CLK, clock enable signal CKE, row address strobe signal/RAS, column address strobe signal/CAS, and write enable signal/WE. Clock control circuit 2 determines, according to change of the logic level of each of row address strobe signal/RAS and column address strobe signal/CAS, whether address signals A0–An taken by address buffer 3 are row or column address signals. When clock control circuit 2 determines that address signals A0–An are row address signals, clock control circuit 2 outputs a signal for activating row address decoder 5 to row address decoder 5 in synchronization with clock signal CLK.

Row address decoder 5 is thus activated according to the signal from clock control circuit 2 to activate a predetermined word line on memory cell array 1 by means of a word line driver (not shown) according to address signals A0–An taken from address buffer 3.

When clock control circuit 2 determines that address signals A0–An are column address signals, clock control circuit 2 outputs a signal for activating column address decoder 6 to column address decoder 6 in synchronization with clock signal CLK.

Column address decoder 6 is thus activated according to the signal from clock control circuit 2 to activate a predetermined bit line pair on memory cell array 1 according to address signals A0–An taken from address buffer 3.

Sense amplifier and I/O control circuit 7 then amplifies a signal on the activated bit line pair and supplies the amplified signal to input/output buffer 4 through an I/O line if this operation is done for reading data.

In this way, memory cells on memory cell array 1 corresponding to address signals A0–An are activated to input/output data.

For data output, input/output buffer 4 receives internal data IDQ read by sense amplifier and I/O control circuit 7 from a bit line pair on memory cell array 1, and accordingly outputs data DQ1–DQi to the outside circuitry in synchronization with clock signal CLK from clock control circuit 2.

For data input, input/output buffer 4 receives externally supplied data DQ1–DQi and accordingly outputs internal data IDQ to sense amplifier and I/O control circuit 7 synchronously with clock signal CLK.

Then, the sense amplifier of sense amplifier and I/O control circuit 7 outputs internal data IDQ to a bit line pair on memory cell array 1.

Clock control circuit 2, address buffer 3, input/output buffer 4, row address decoder 5, column address decoder 6 and sense amplifier and I/O control circuit 7 each operate by being supplied with internal power supply int.VDD from VDC circuit 8. Here, VDC circuit 8 lowers external power supply ext.VDD to predetermined internal power supply int.VDD which is then supplied to each circuit in the semiconductor memory device.

Pad Arrangement

[First Embodiment]

Figure 2:
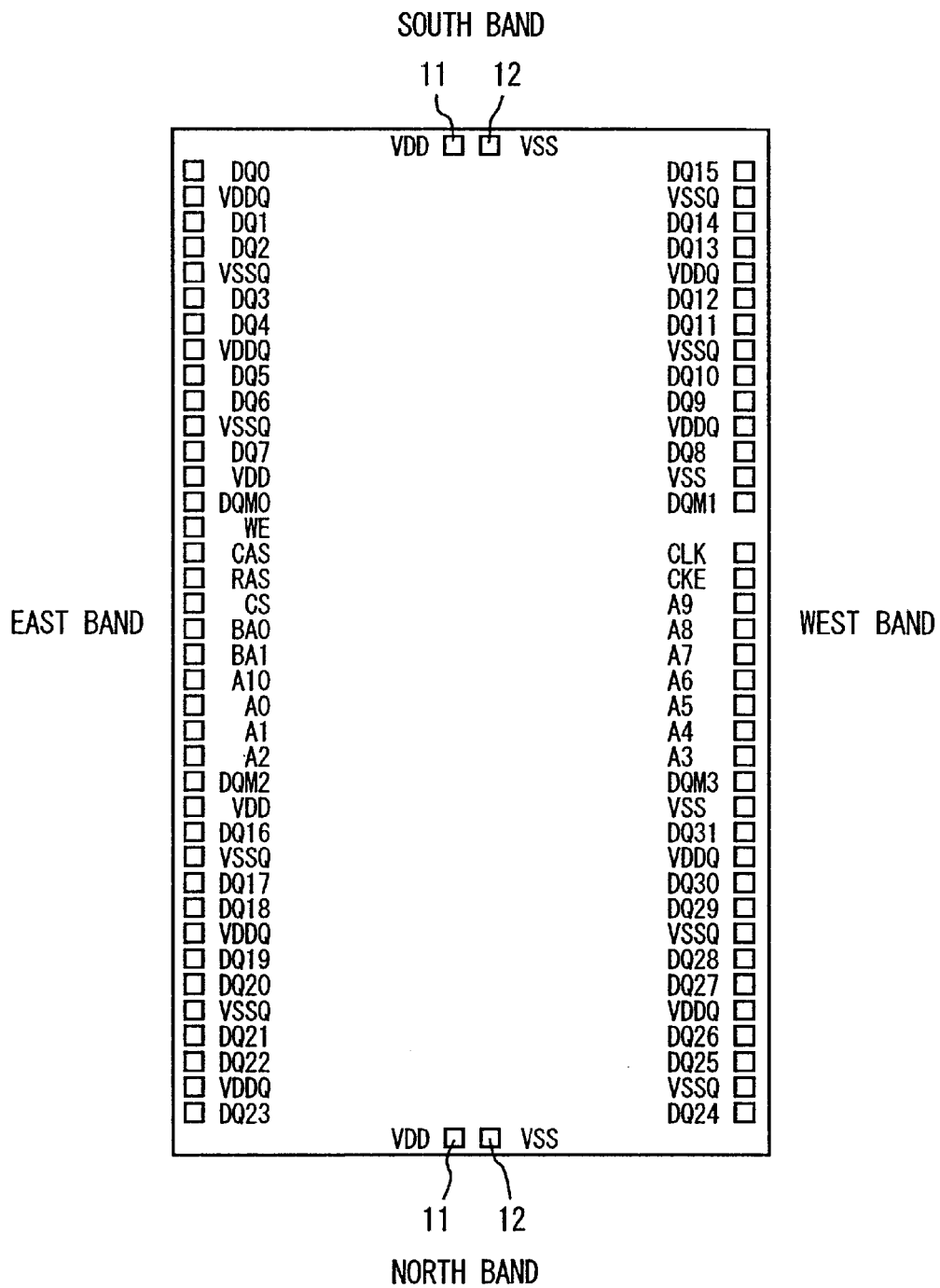
FIG. 2 shows a pad arrangement of a semiconductor memory device according to a first embodiment of the present invention.

FIG. 2 shows an arrangement of pads of a semiconductor memory device according to a first embodiment of the present invention. Referring to FIG. 2, the pads are arranged on the peripheral region along the two opposing sides of the semiconductor memory device. (The peripheral region along the two sides where the pads are arranged is hereinafter referred to as EAST/WEST band or E/W band.) In addition, VDD and VSS pads 11 and 12 serving as power supply pads that are arranged on respective ends of pad lines for the conventional device are arranged near respective centers of the remaining two sides where other pads are not arranged. (The peripheral region along those remaining two sides that is not the EAST/WEST band is hereinafter referred to as NORTH/SOUTH band or N/S band.)

According to the first embodiment, the pads are arranged on the E/W band on the periphery of the semiconductor memory device and the outermost power supply pads are arranged near the center of the N/S band. Then, the leadframe for a TSOP can be designed by effectively utilizing the space outside the N/S band, and the pads can thus be arranged on the peripheral region which has been difficult to accomplish.

Thus, the semiconductor memory device with its pads arranged on the peripheral region is adaptable to the TSOP so that this semiconductor memory device is adaptable to various packages including BGA package and MCP that have been implemented by arranging pads on the peripheral region.

[Second Embodiment]

According to a second embodiment, the pads on the end regions of the pad lines on the E/W band of the first embodiment are arranged in the order reversed relative to the order of the arranged pins of the package.

Figure 3:
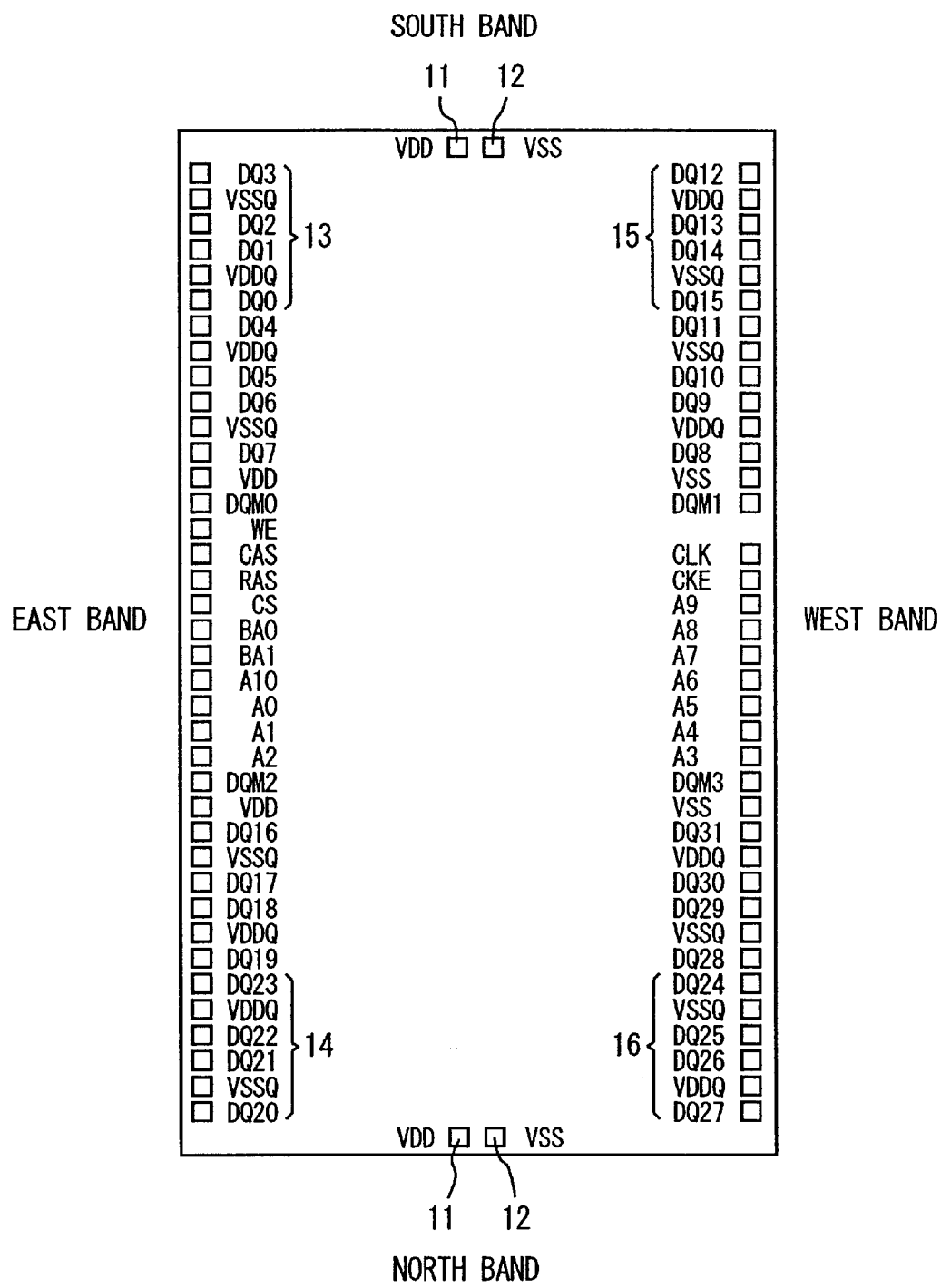
FIG. 3 shows a pad arrangement of a semiconductor memory device according to a second embodiment of the present invention.

FIG. 3 shows an arrangement of pads of a semiconductor memory device according to the second embodiment. In each of respective pad groups denoted by reference numerals 13–16, pads are arranged in the order reversed relative to the arranged pins of the package. Specifically, the pads indicated by reference numeral 13 correspond to the pins denoted by reference character 13A in FIG. 28 where the semiconductor memory device is packaged. The pins denoted by reference character 13A are arranged in the order, from the outermost pin, DQ0, VDDQ, DQ1, DQ2, VSSQ, DQ3.

Referring again to FIG. 3, pads indicated by reference numeral 13 are arranged in the order, from the outermost pad, DQ3, VSSQ, DQ2, DQ1, VDDQ, DQ0, this order being reversed relative to the pin order indicated by reference character 13A.

Similarly, those pads indicated by reference numerals 14–16 are arranged in the reverse order.

Figure 4:
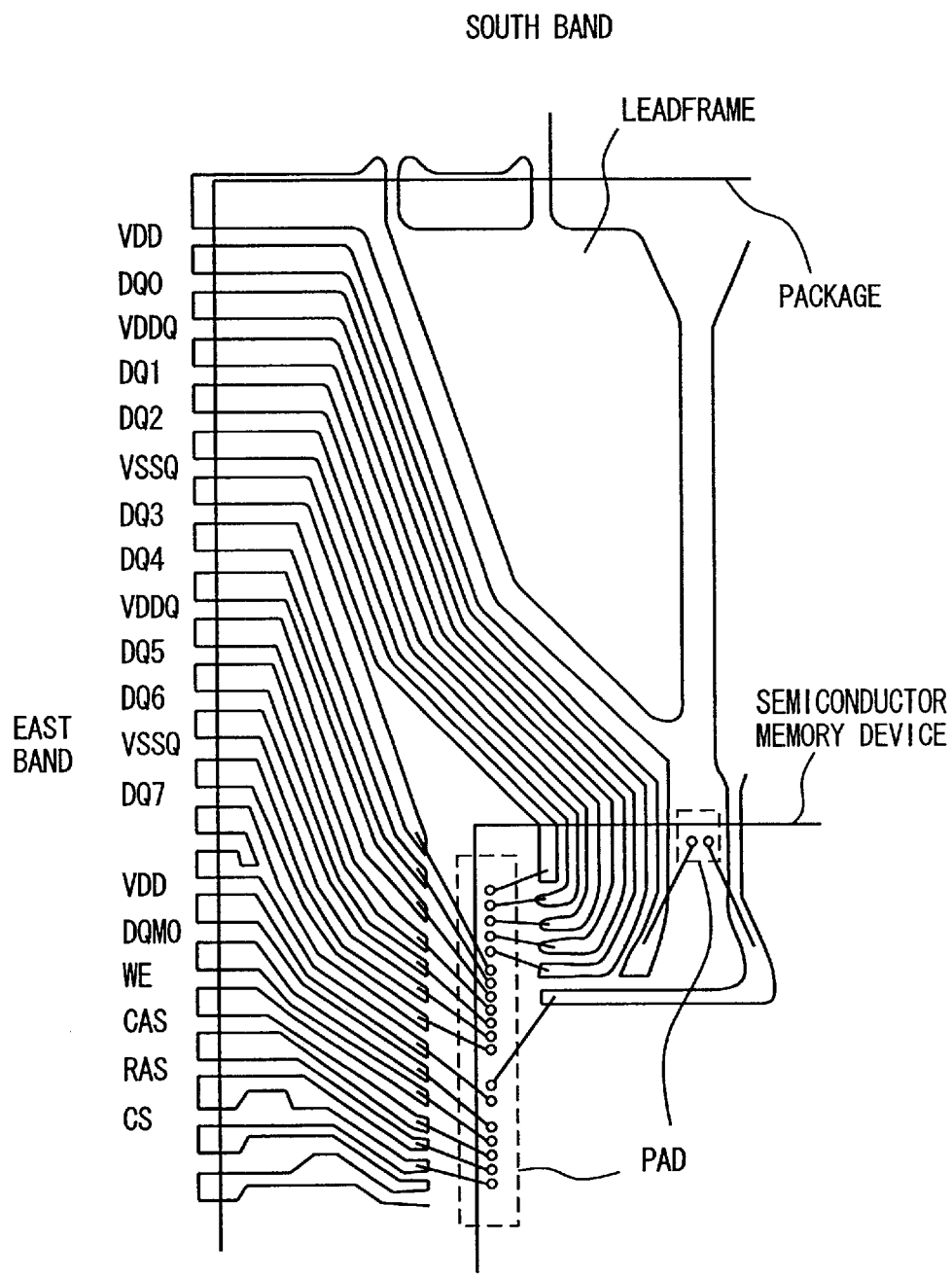
FIG. 4 shows a leadframe layout when the semiconductor memory device of the second embodiment is packaged with a TSOP.

FIG. 4 shows a leadframe layout when the semiconductor memory device of the second embodiment is packaged in a TSOP. FIG. 4 is an enlarged view of one corners respectively of the package and semiconductor memory device. Other corners have respective layouts similar to that shown in FIG. 4. As shown in FIG. 4, the pads in the end region are connected to the leadframe extended round from the N/S band, so that this semiconductor memory device with pads arranged on the peripheral region is adaptable to the TSOP.

According to the second embodiment, the pads of the semiconductor memory device are arranged on the peripheral region, the outermost power supply pads are arranged on the N/S band, and the pads in the end regions of the pad lines are arranged in the reverse order relative to the order of package pins. Accordingly, layout design of the leadframe is facilitated.

Moreover, the semiconductor memory device of the second embodiment is adaptable to the TSOP while having pads arranged on the peripheral region. The semiconductor memory device is accordingly adaptable to various packages like BGA package and MCP for example that have been implemented by arranging pads on the peripheral region.

[Third Embodiment]

Figure 5:
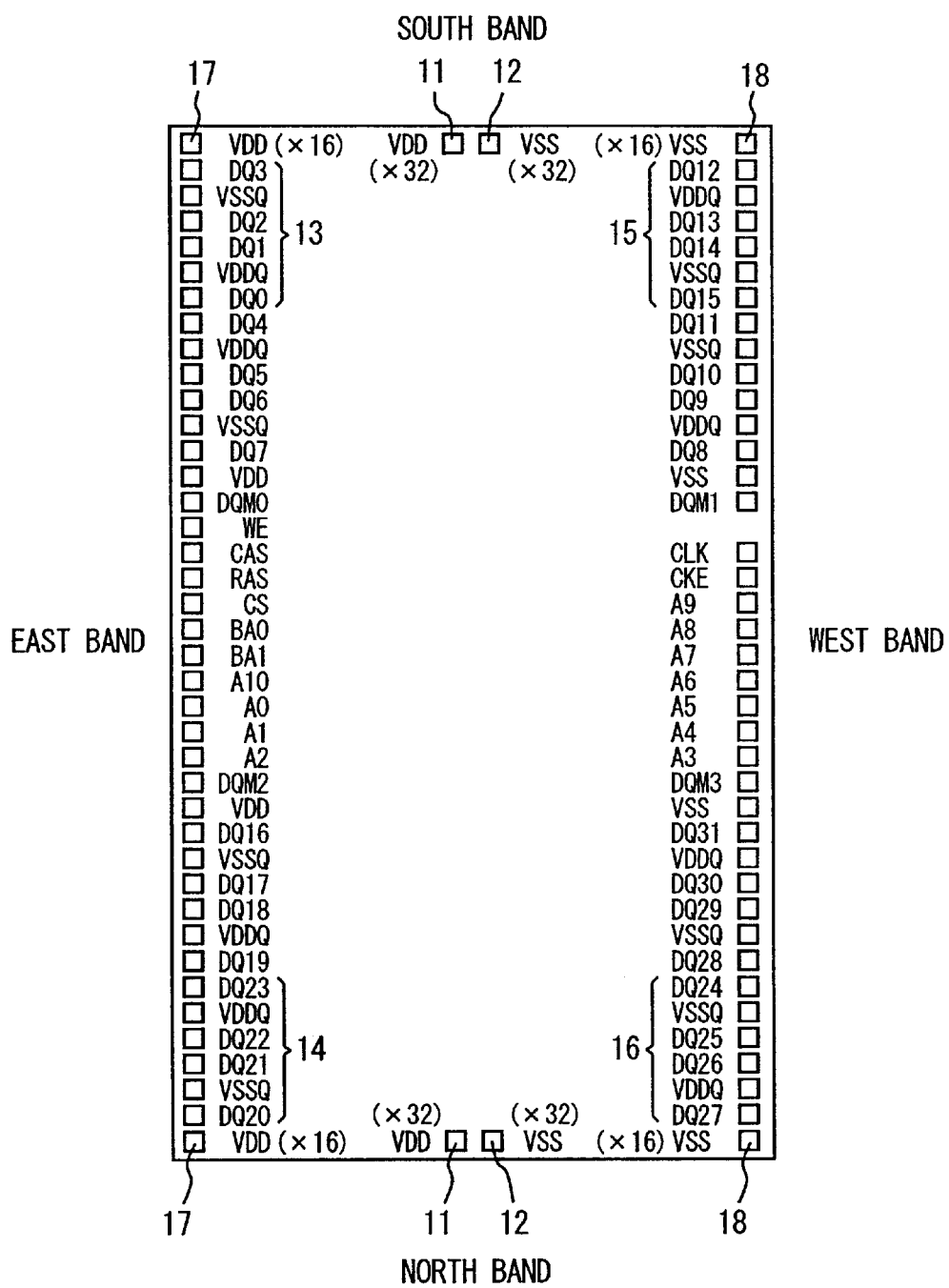
FIGS. 5 to 8 show respective pad arrangements of semiconductor memory devices according to third to sixth embodiments of the present invention.

Referring to FIG. 5, according to a third embodiment, VDD and VSS pads 17 and 18, which are used for the semiconductor memory device when the device is used as a device of x16-bit, are added to the pads of the second embodiment, and VDD and VSS pads 17 and 18 are arranged on respective ends of the pad lines of the E/W band. VDD and VSS pads 11 and 12 described above in connection with the second embodiment are used as power supply pads when the semiconductor memory device is used as a device of x32-bit.

When the semiconductor memory device is a x16-bit device, the number of pins is accordingly small. In such a case, the semiconductor memory device with its pads arranged on the peripheral region of the E/W band only is adaptable to a TSOP.

If the semiconductor memory device used as the x16-bit device is applied to a BGA package, the package size can rather be reduced by employing VDD and VSS pads 17 and 18 arranged on the E/W band not by employing VDD and VSS pads 11 and 12.

In addition, for the MCP which is frequently implemented with x16-bit, pads are preferably arranged on the two sides only for facilitating design, since semiconductor memory devices stacked on each other are packaged in the MCP.

As discussed above, according to the third embodiment, VDD and VSS pads 11 and 12 arranged on the N/S band are used for the x32-bit configuration while VDD and VSS pads 17 and 18 arranged on respective ends of the pad lines of E/W band are added for the x16-bit configuration. Then, the semiconductor memory device is adaptable to various packages such as TSOP, BGA package and MCP for example.

[Fourth Embodiment]

Figure 6:
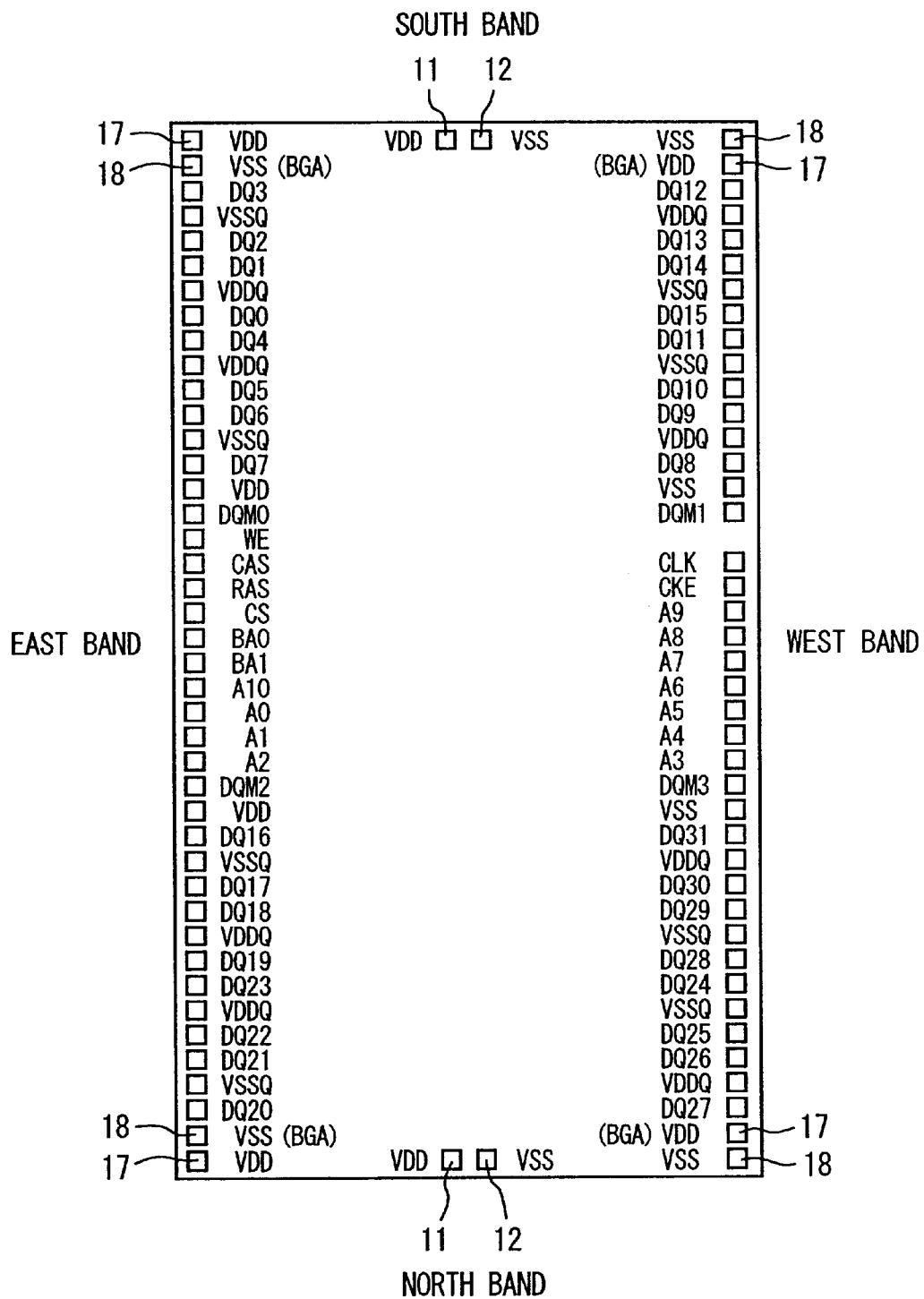

Referring to FIG. 6, according to a fourth embodiment, VDD and VSS pads 17 and 18 in pairs are arranged on respective ends of pad lines arranged on the E/W band.

The semiconductor memory device of the fourth embodiment can be adapted to a BGA package where each of the outermost pads can be wired.

According to the fourth embodiment, the semiconductor memory device is adaptable to various packages. In addition, the semiconductor memory device has VDD pads 17 and VSS pads 18 arranged in pairs on respective ends of the pad lines on the E/W band so that redundancy is added to the power-supply system which is accordingly reinforced.

[Fifth Embodiment]

According to a fifth embodiment, VDDQ and VSSQ pads for x16-bit and x32-bit are arranged between DQ pads on each end of the pad lines on the E/W band.

Like the VDD and VSS pads, VDDQ and VSSQ pads are also power supply pads to which power supply is externally provided. DQ pads are used for input and output of data from and to the outside.

Figure 7:
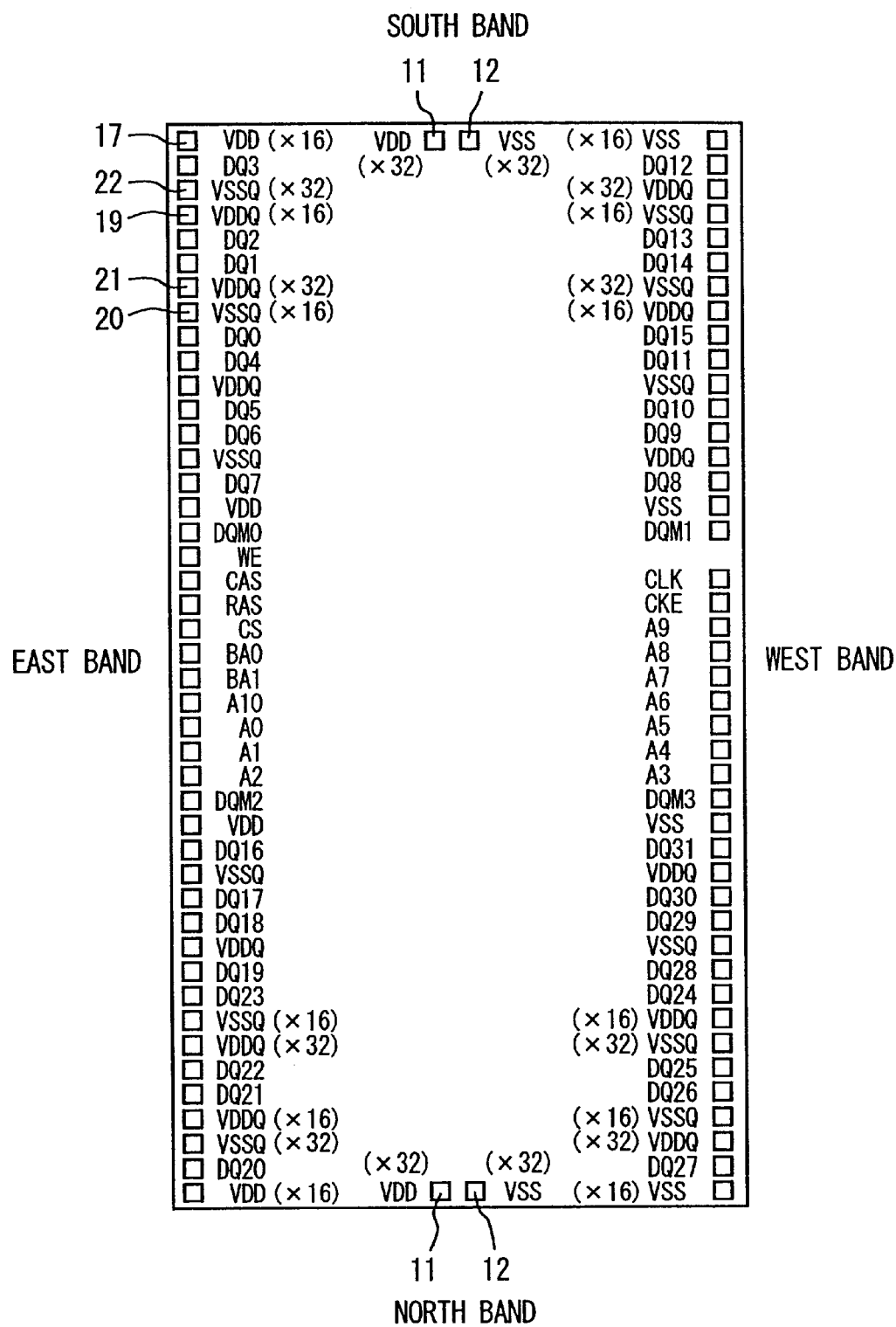

Referring to FIG. 7, a semiconductor memory device includes a VDDQ pad 19 and a VSSQ pad 20 for x16-bit as well as a VDDQ pad 21 and a VSSQ pad 22 for x32-bit that are arranged on each end of pad lines arranged on the E/W band. VDDQ pad 21 and VSSQ pad 22 are arranged in the reverse order relative to the order of pins arranged on a package.

For the x32-bit configuration requiring a high pin count, it is difficult to extend the leadframe directly from the package pins to the pad lines. Then, as shown in FIG. 4, the leadframe can be designed by being extended round from the N/S band to the pads on the end regions of the pad lines arranged on the E/W band.

Here, it is noted that the order of data signals DQi input/output through DQ pads can be changed by merely changing signal definition, and thus the data signals may be input/output via pads different from original pads. However, for the power supply, power supply pads and ground pads cannot be changed.

Then, as shown in FIG. 7, VDDQ and VSSQ pads for the x16-bit configuration and VDDQ and VSSQ pads for the x32-bit configuration are provided separately, VDDQ and VSSQ pads 21 and 22 for the x32-bit configuration are arranged in the reverse order relative to the pin order, and then the leadframe structure shown in FIG. 4 is implemented. Consequently, the order of VDDQ and VSSQ pads is the same as seen from the outside of the package.

For the x16-bit configuration requiring a smaller pin count, the leadframe layout shown in FIG. 4 is unnecessary. Rather, the leadframe layout in FIG. 4 employed for the x16-bit configuration increases the size of the semiconductor device. Therefore, the leadframe is not extended round as shown in FIG. 4. VDDQ and VSSQ pads 19 and 20 for the x16-bit configuration are thus arranged in the same order as the order of pins.

For the semiconductor memory device according to the fifth embodiment, the order of VDDQ and VSSQ pins is the same as seen from the outside regardless of whether the semiconductor memory device has the x16-bit configuration or x32-bit configuration. This semiconductor device is thus adaptable to various packages and additionally adaptable to both of x16-bit and x32-bit.

[Sixth Embodiment]

According to a sixth embodiment, all of the pad structures described in connection with the first to fifth embodiments respectively are combined.

Figure 8:
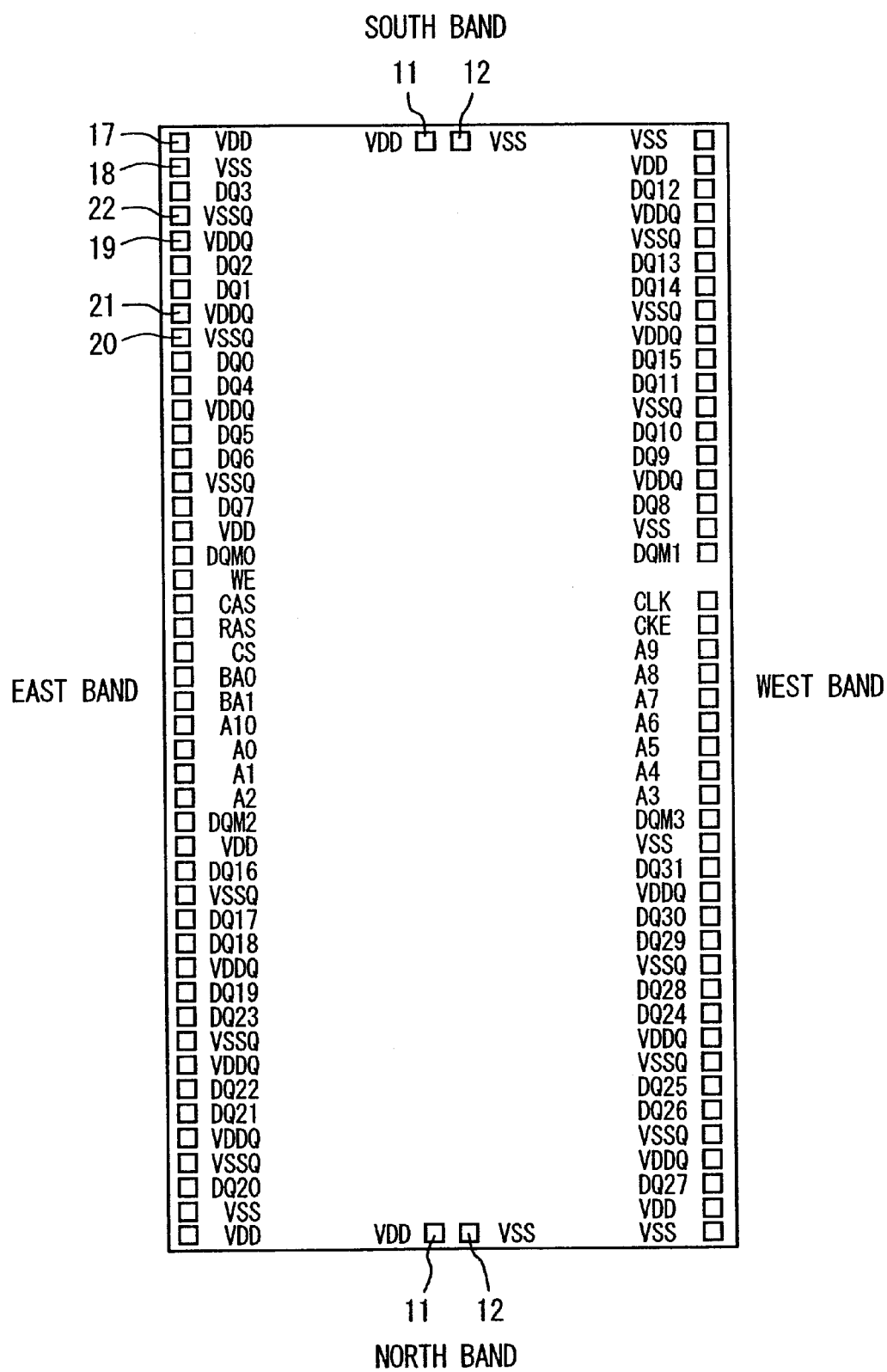

Referring to FIG. 8, pads of a semiconductor memory device are arranged on the peripheral region along each E/W band. In addition, VDD and VSS pads 11 and 12 for ×32-bit configuration are arranged near the center of the N/S band. Further, those pads on each end of the pad lines are arranged in the reverse order relative to the pin order. Moreover, VDDQ and VSSQ pads 21 and 22 included in the reverse-order pads are used for the ×32-bit configuration while VDDQ and VSSQ pads 19 and 20 for the ×16-bit configuration are arranged in the same order as the pin order. Additionally, VDD and VSS pads 17 and 18 for the ×16-bit configuration are arranged in pairs on respective ends of the pad lines.

According to the sixth embodiment, the semiconductor memory device is adaptable to any of the BGA package, MCP and TSOP and further adaptable to any of ×16- and ×32-bit configurations. The semiconductor memory device is thus adapted to various structures by merely selecting a bonding option in an assembly process.

VDC Circuit

[Seventh Embodiment]

According to a seventh embodiment, like the first to sixth embodiments, pads are arranged on each E/W band and VDD and VSS pads, which are arranged as the outermost pads of pad lines for the conventional device, are arranged near the center of the N/S band. Moreover, according to the seventh embodiment, VDC circuits are arranged in the vicinity of the power supply pads. The VDC circuits include VDCS circuit for a memory cell array and VDCP circuit for peripheral circuitry.

Figure 9:
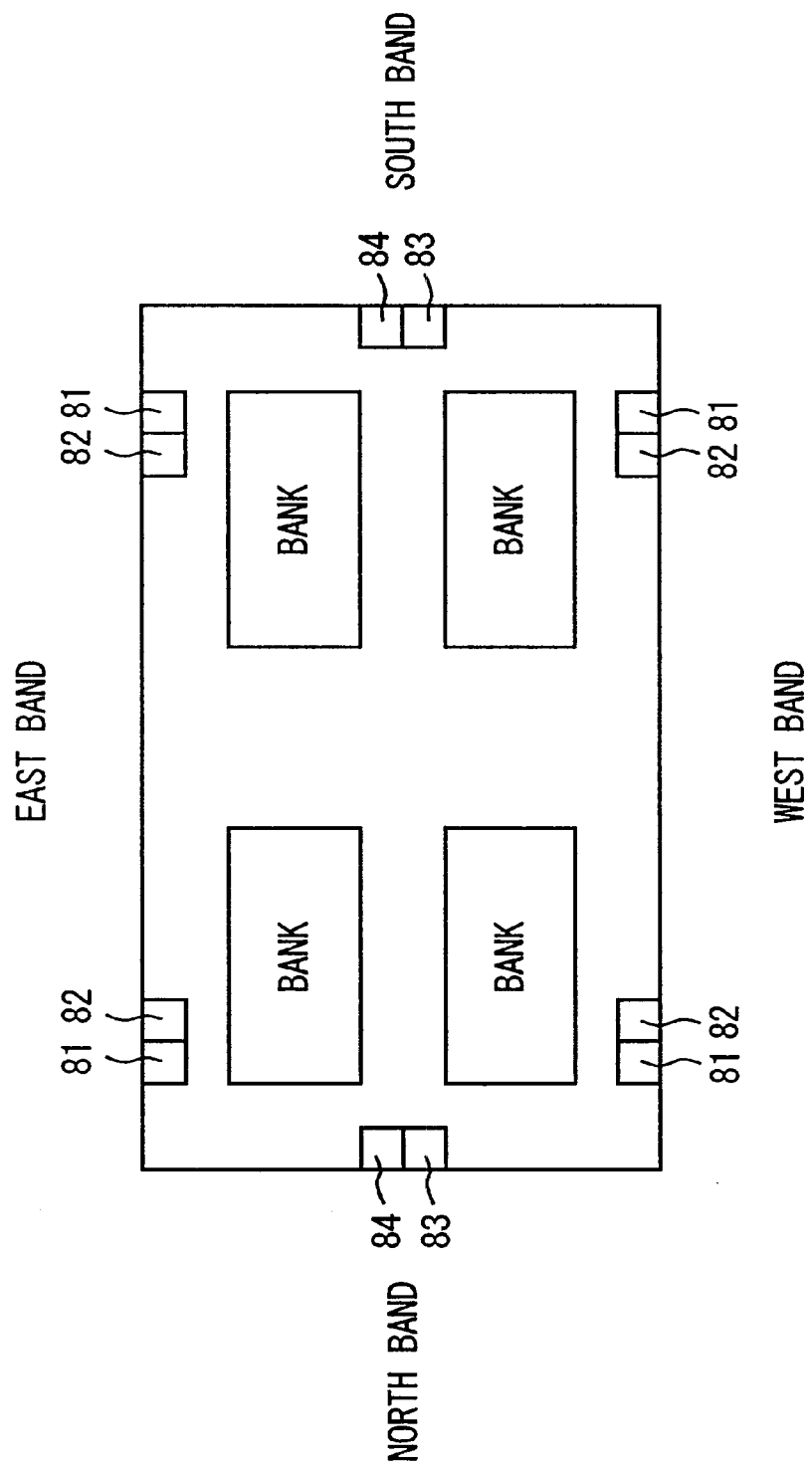
FIG. 9 shows a layout of VDCS and VDCP circuits of the semiconductor memory device according to the present invention.

FIG. 9 shows a layout of VDCS and VDCP circuits according to the seventh embodiment. On each E/W band, two VDCS circuits 81 and two VDCP circuits 82 that are chiefly used for BGA package and MCP are arranged. In addition, VDCS and VDCP circuits 83 and 84 that are chiefly used for TSOP are arranged on the central part of the N/S band.

VDCS and VDCP circuits 81 and 82 arranged on the E/W band each may be used for the ×16-bit configuration and VDCS and VDCP circuits 83 and 84 arranged on the N/S band each may be used for the ×32-bit configuration.

The number of VDCS circuits 81 and 83 and VDCP circuits 82 and 84 is not limited to that shown in FIG. 9 and may be any required number according to the capacity of internal circuitry using the power supply.

According to the seventh embodiment, VDCS and VDCP circuits are arranged on the peripheral region according to the pads arranged on the peripheral region and those circuits are placed as close as possible to the power supply pads. The semiconductor memory device with pads arranged on the peripheral region is thus adaptable to various packages without deterioration in power supply characteristics.

[Eighth Embodiment]

According to an eighth embodiment, the ability of VDCS circuits 81 and 83 or VDCP circuits 82 and 84 can be changed depending on whether a semiconductor memory device is used as a ×16-bit device or ×32-bit device. In other words, a ×16-bit semiconductor memory device can operate with a smaller power than that required when the device is used as a ×32-bit device and accordingly the ability of the VDC circuits can appropriately be made lower for reducing power consumption.

VDCS circuits 81 and 83 and VDCP circuits 82 and 84 have the same structure. Then, the structure is hereinafter described of VDCS circuit 81.

Figure 10:
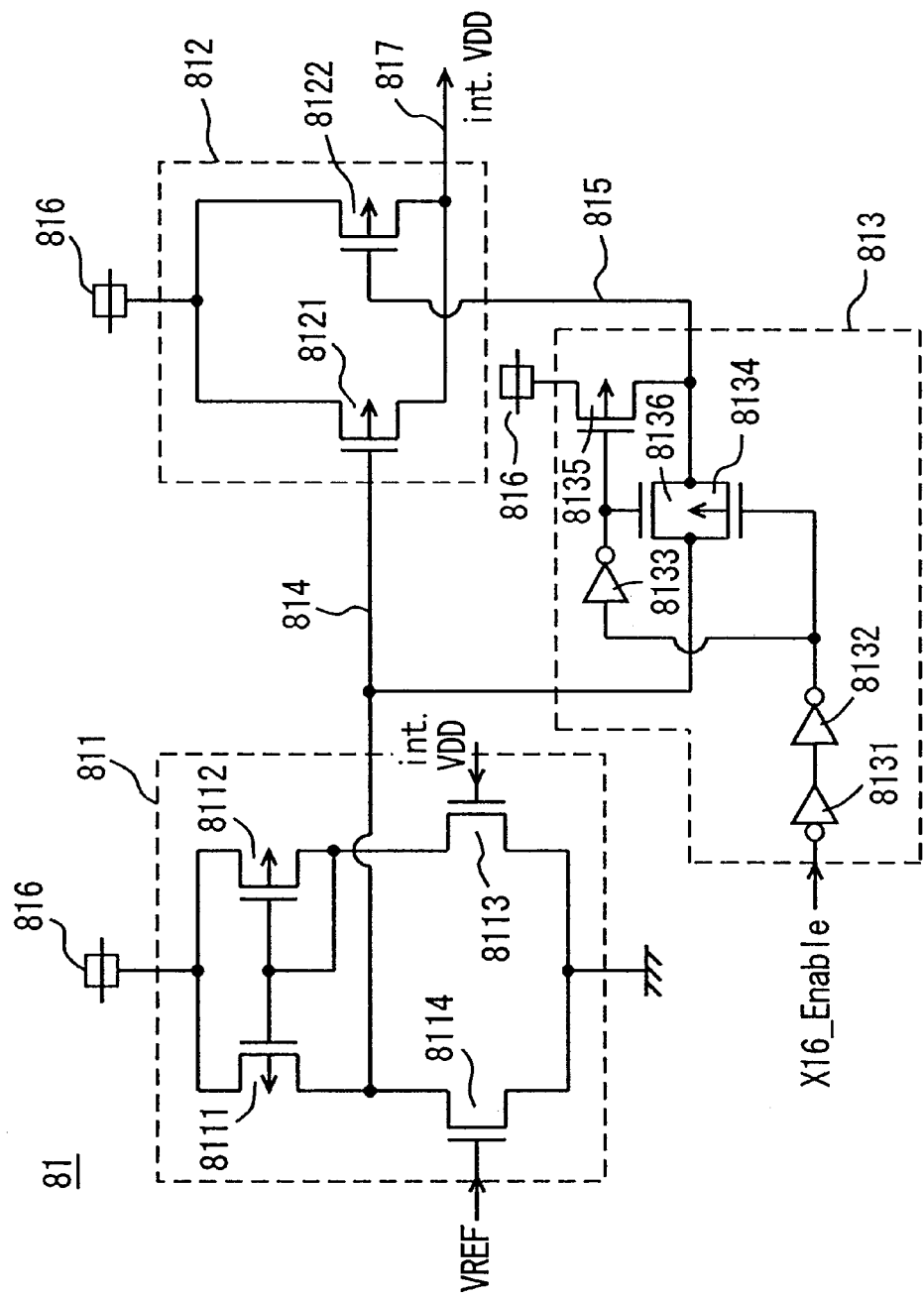
FIGS. 10 and 11 show respective circuit diagrams of VDCS circuits according to eighth and ninth embodiments of the present invention.

Referring to FIG. 10, VDCS circuit 81 includes a differential amplifier circuit 811, a driving circuit 812, a switching circuit 813, internal nodes 814 and 815, an external power supply node 816, and an internal power supply node 817.

Differential amplifier circuit 811 includes P channel MOS transistors 8111 and 8112 and N channel MOS transistors 8113 and 8114. N channel MOS transistor 8113 receives internal power supply potential int.VDD as a driving potential that is output from VDCS circuit 81. N channel MOS transistor 8114 receives reference potential VREF as a driving potential that is a target potential of internal power supply potential int.VDD.

Differential amplifier circuit 811 amplifies a potential difference between internal power supply potential int.VDD and reference potential VREF and outputs the amplified potential difference as an output potential to internal node 814.

Driving circuit 812 includes P channel MOS transistors 8121 and 8122. P channel MOS transistor 8121 receives the output potential from differential amplifier circuit 811 as a driving potential. P channel MOS transistor 8122 receives an output potential from switching circuit 813 described later as a driving potential.

Driving circuit 812 lowers, according to respective output potentials of differential amplifier circuit 811 and switching circuit 813, external power supply potential ext.VDD from external power supply node 816 to internal power supply potential int.VDD which is accordingly output to internal power supply node 817.

Switching circuit 813 includes inverters 8131–8133, P channel MOS transistors 8134 and 8135, and an N channel MOS transistor 8136. A signal supplied to inverter 8131 has H logical high) level when the semiconductor memory device is used as a ×16-bit device and has L (logical low) level when the semiconductor memory device is used as a ×32-bit device. P channel MOS transistor 8134 receives an output of inverter 8132 as a driving potential. N channel MOS transistor 8136 and P channel MOS transistor 8135 receive an output of inverter 8133 as a driving potential.

The drain side of P channel MOS transistor 8135 is connected to external power supply node 816.

If the signal supplied to inverter 8131 has H level, i.e., for ×16-bit configuration, switching circuit 813 charges internal node 815 to cause the node to reach external power supply potential ext.VDD via P channel MOS transistor 8135.

On the other hand, if the signal supplied to inverter 8131 has L level, i.e., for ×32-bit configuration, switching circuit 813 supplies the potential level of internal node 814 directly to internal node 815.

When the semiconductor memory device operates as a ×32-bit device and internal power supply potential int.VDD is higher than reference potential VREF, the output potential of differential amplifier circuit 811 provided to internal node 814 has H level so that P channel MOS transistors 8121 and 8122 of driving circuit 812 are both turned off and current supply to internal power supply node 817 is stopped. Consequently, internal power supply potential int.VDD decreases.

On the other hand, when internal power supply potential int.VDD is lower than reference potential VREF, the output potential of differential amplifier circuit 811 provided to internal node 814 has L level so that P channel MOS transistors 8121 and 8122 of driving circuit 812 are both turned on and current is supplied from external power supply node 816 to internal power supply node 817 via P channel MOS transistors 8121 and 8122. Accordingly, internal power supply potential int.VDD increases.

When the semiconductor memory device operates as a ×16-bit device, the potential level of internal node 815 is H level as described above so that P channel MOS transistor 8122 of driving circuit 812 is always in OFF state. When internal power supply potential int.VDD is higher than reference potential VREF, the output potential of differential amplifier circuit 811 provided to internal node 814 has H level so that P channel MOS transistor 8121 of driving circuit 812 is turned off and current supply to internal power supply node 817 is stopped. Internal power supply potential int.VDD accordingly decreases.

On the other hand, when internal power supply potential int.VDD is lower than reference potential VREF, the output potential of differential amplifier circuit 811 provided to internal node 814 has L level so that P channel MOS transistor 8121 of driving circuit 812 is turned on and current is supplied from external power supply node 816 to internal power supply node 817 via P channel MOS transistor 8121. Then, internal power supply potential int.VDD increases. However, P channel MOS transistor 8122 is in OFF state and thus the current supply ability of driving circuit 812 to internal power supply node 817 is a half of that when the semiconductor device operates as a ×32-bit device. The ability is thus lowered.

According to the eighth embodiment, the ability of the VDC circuit is thus appropriately adjusted for the ×16-bit device which consumes less power than that of the ×32-device, and thus power savings are achieved for the ×16-bit device.

[Ninth Embodiment]

The ability of driving circuit 812 for the ×16-bit configuration is made lower according to the eighth embodiment. According to a ninth embodiment, the ability of differential amplifier circuit 811 is lowered to achieve similar advantage to that of the eighth embodiment.

According to the ninth embodiment, instead of VDCS circuits 81 and 83 and VDCP circuits 82 and 84, VDCS circuits 81A and 83A and VDCP circuits 82A and 84A are employed respectively. VDCS circuits 81A and 83A and VDCP circuits 82A and 84A have the same structure. The structure is hereinafter described of VDCS circuit 81A.

Figure 11:
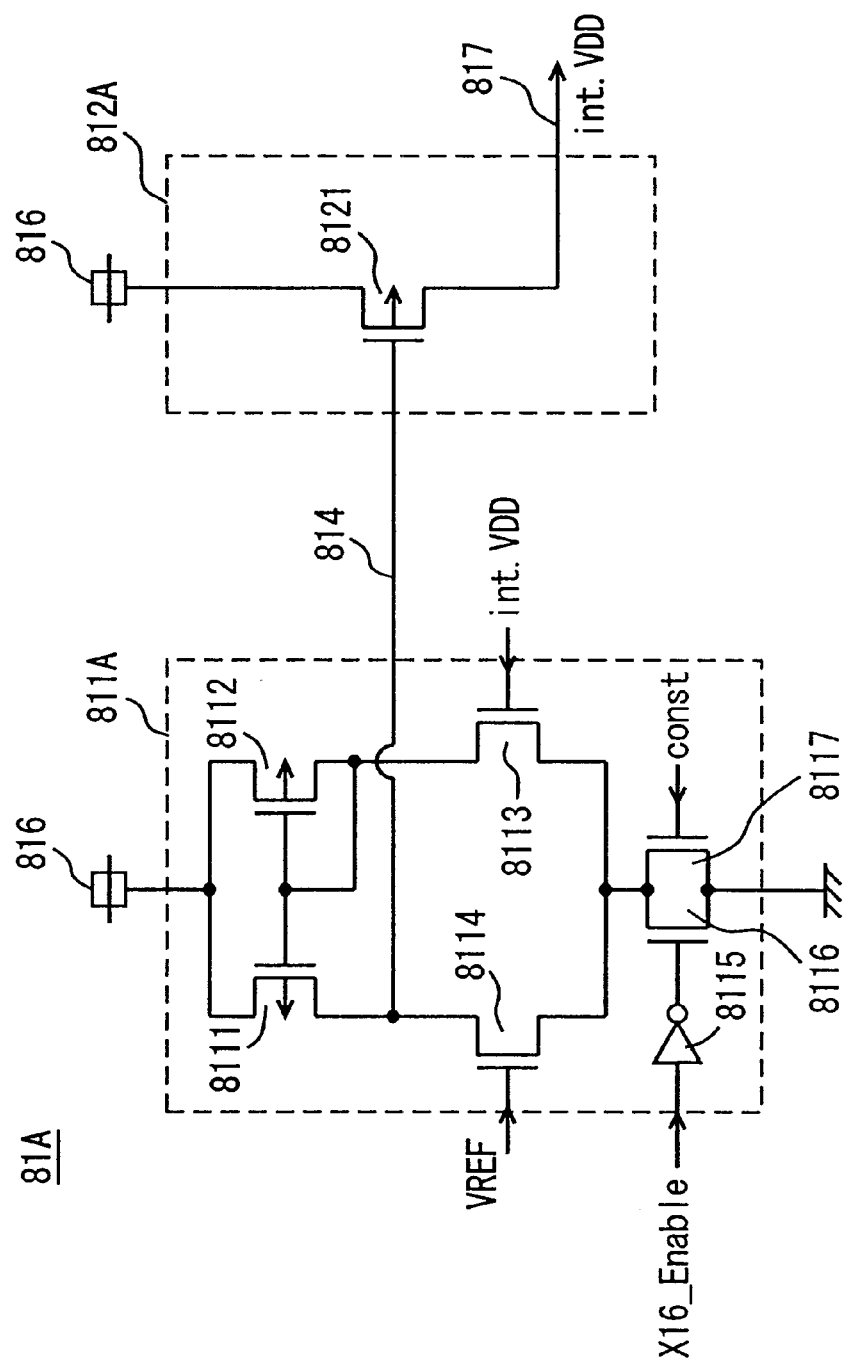

Referring to FIG. 11, VDCS circuit 81A includes a differential amplifier circuit 811A, a driving circuit 812A, an internal node 814, an external power supply node 816, and an internal power supply node 817.

Differential amplifier circuit 811A includes, in addition to the components of differential amplifier circuit 811 of the eighth embodiment described above, an inverter 8115 and N channel MOS transistors 8116 and 8117.

When the semiconductor memory device is used as a ×16-bit device, a signal supplied to inverter 8115 has H level while it has L level when the semiconductor memory device is used as a ×32-bit device. N channel MOS transistor 8116 receives an output of inverter 8115 as a driving potential. N channel MOS transistor 8117 supplied with a driving potential always having H level is always in ON state.

Differential amplifier circuit 811A amplifies a potential difference between internal power supply potential int.VDD and reference potential VREF and outputs the amplified potential difference as an output potential to internal node 814. The potential level provided to internal node 814 is different depending on the signal supplied to inverter 8115.

When the signal supplied to inverter 8115 has H level, i.e., for ×16-bit configuration, N channel MOS transistor 8116 is turned off so that the potential level of internal node 814 is relatively higher than that when N channel MOS transistor 8116 is in ON state as the device is used as the ×32-bit device.

Driving circuit 812A is constituted of a P channel MOS transistor 8121 only. P channel MOS transistor 8121 using the potential on internal node 814 as a driving potential lowers external power supply potential ext.VDD provided from external power supply node 816 to internal power supply potential int.VDD which is accordingly supplied to internal power supply node 817.

As described above, for the ×16-bit configuration, the potential level of internal node 814 in VDCS circuit 81A is relatively higher than that for the ×32-bit configuration, so that the current supplied in driving circuit 812A from external power supply node 816 to internal power supply node 817 is decreased. In other words, the ability of VDCS circuit 81A for the ×16-bit configuration is lower than that for the ×32-bit configuration.

In this way, according to the ninth embodiment, the ability of the VDC circuit is appropriately adjusted for the ×16-bit device which consumes less power than that of the ×32-device, and thus the power savings can be achieved for the ×16-bit configuration as done according to the eighth embodiment.

ALIVE Circuit

[Tenth Embodiment]

According to a tenth embodiment, an ALIVE circuit serving as power-on circuit is connected to any one of VDCS circuits 81 for the ×16-bit configuration that are arranged on the E/W band in the seventh embodiment.

Figure 12:
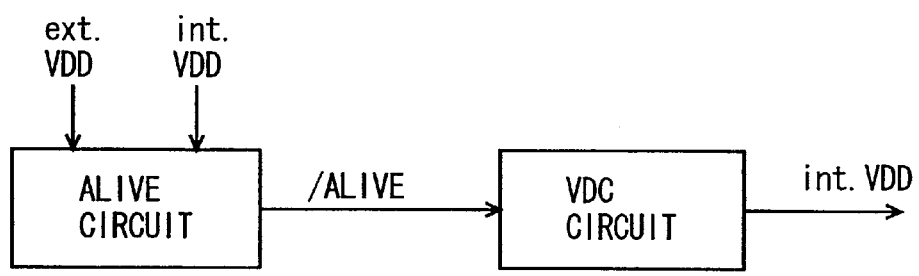
FIG. 12 is a schematic block diagram of an ALIVE circuit illustrating functions thereof according to the present invention.

Referring to FIG. 12, the ALIVE circuit connected to a VDC circuit generates signal/ALIVE and supplies the signal to the VDC circuit for enhancing the ability of the VDC circuit when internal power supply potential int.VDD does not reach a sufficient level after power-on of the semiconductor memory device.

Then, the VDC circuit receives signal/ALIVE to increase current supplied to the internal power supply node and accordingly cause internal power supply potential int.VDD to rise earlier.

Figure 13:
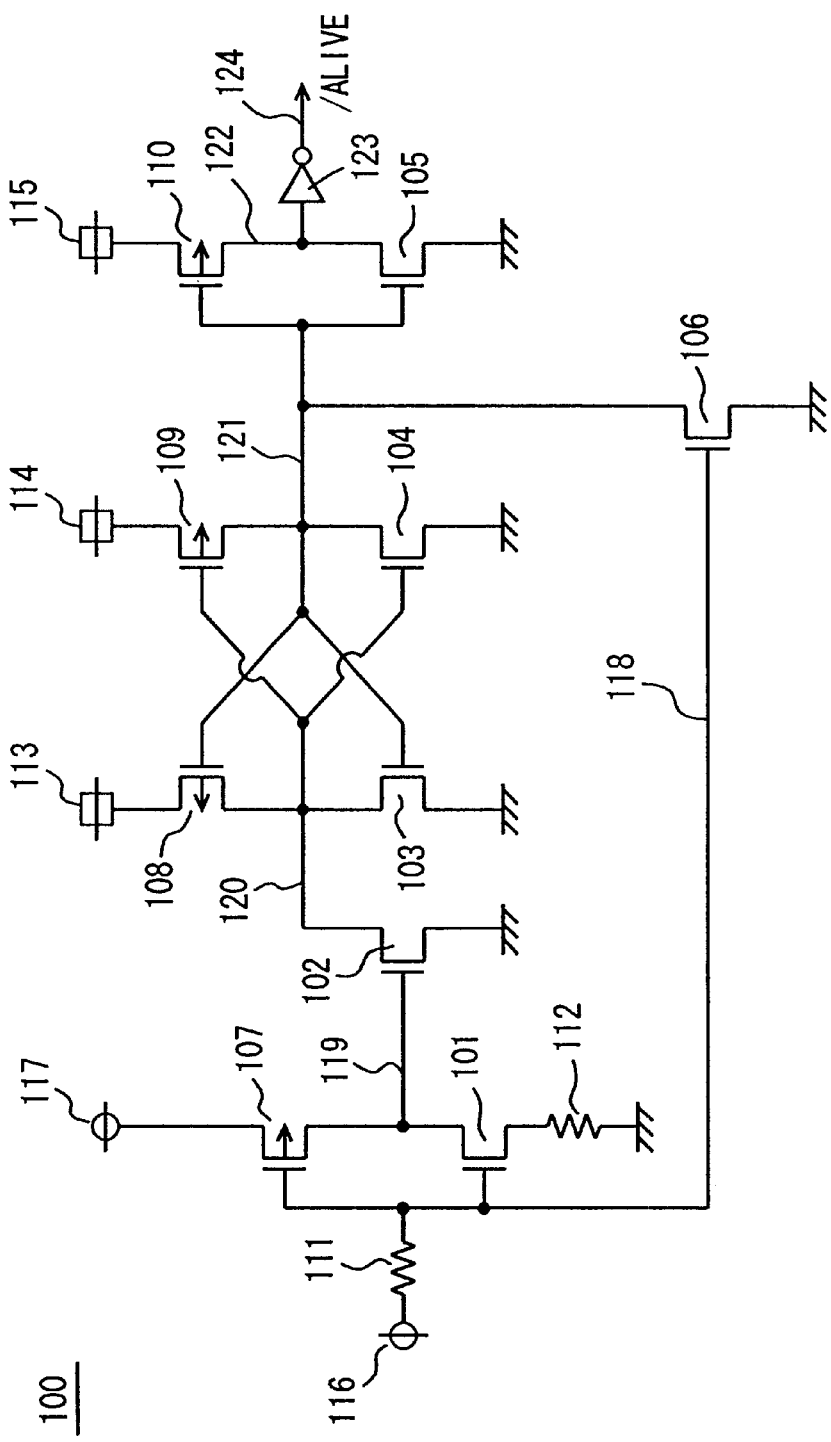
FIG. 13 is a circuit diagram of the ALIVE circuit shown in FIG. 12.

FIG. 13 shows a circuit structure of the ALIVE circuit. ALIVE circuit 100 includes N channel MOS transistors 101–106, P channel MOS transistors 107–110, resistors 111 and 112, external power supply nodes 113–115, internal power supply nodes 116 and 117, internal nodes 118–122, an inverter 123, and an output node 124.

Suppose that the whole circuit is powered off in the initial state and external power supply potential ext.VDD and internal power supply potential int.VDD both have L level. After power-on, external power supply potential ext.VDD rises to H level while internal power supply potential int.VDD providing power supply to numerous internal circuits does not rise to H level immediately after the power-on.

At this time, ALIVE circuit 100 has its internal state as follows. External power supply nodes 113–115 have H level, internal power supply nodes 116 and 117 have L level, internal node 118 has L level according to the L level of internal power supply node 116, internal node 119 has L level according to the L level of internal power supply node 117, internal node 120 has L level, internal node 121 has H level as external power supply node 114 and internal node 120 have H and L levels respectively. Accordingly, internal node 122 has L level so that signal/ALIVE supplied via inverter 123 to output node 124 has H level.

Then, internal power supply potential int.VDD rises to change the internal state of ALIVE circuit 100 as described below. Internal power supply potential int.VDD on internal power supply nodes 116 and 117 has H level and accordingly internal node 118 has H level and internal node 121 has L level. Internal power supply node 122 thus has H level so that signal/ALIVE supplied via inverter 123 to output node 124 has L level. Further, internal node 119 has L level according to the H level of internal power supply node 116, and internal node 120 has H level according to H and L levels respectively of external power supply node 113 and internal node 121.

Thus, node 121 is provided with no current from external power supply node 114 and remains at L level, and signal/ALIVE provided to output node 124 also remains at L level.

Figure 14:
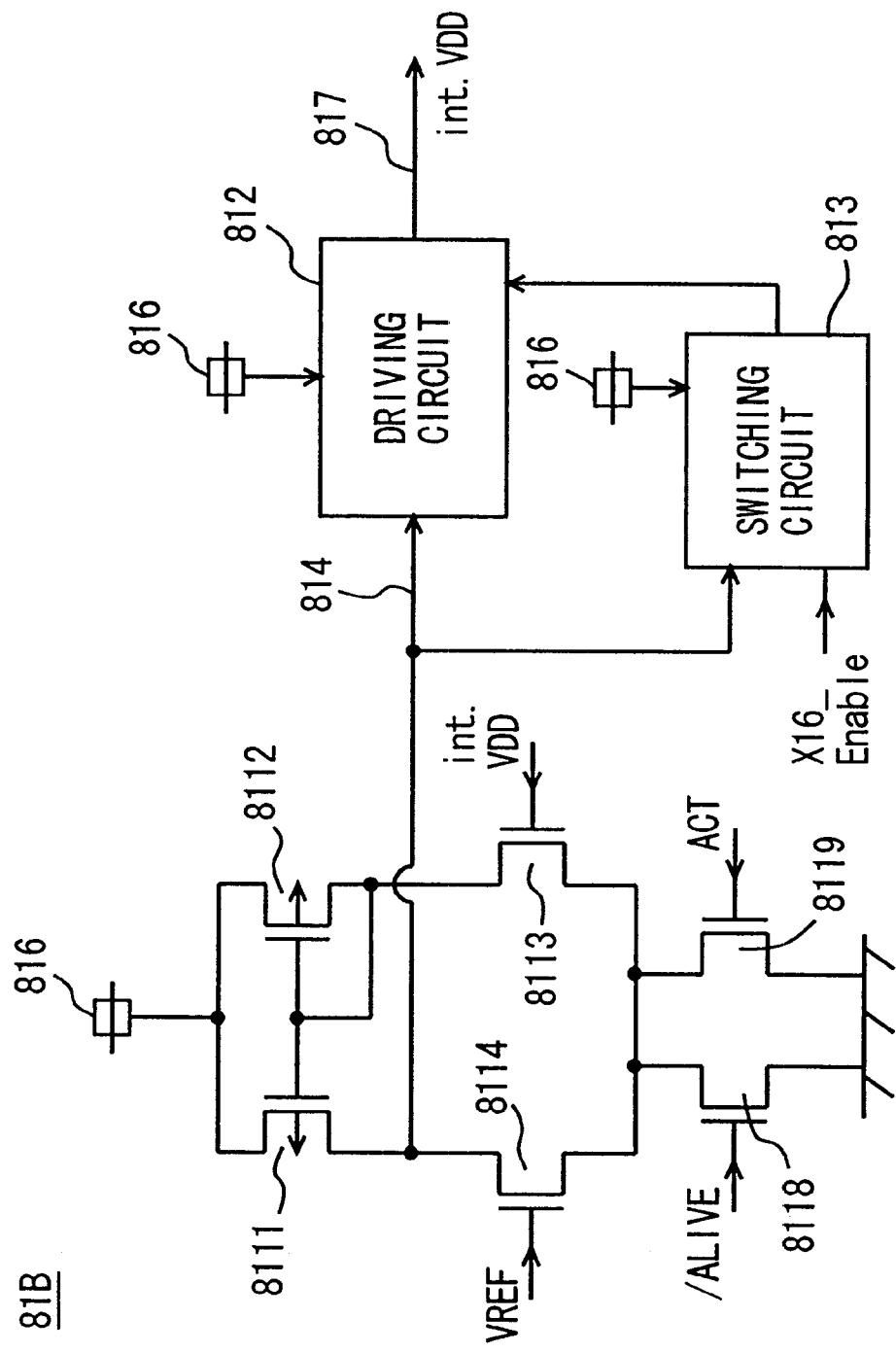
FIG. 14 is a circuit diagram of a VDCS circuit receiving a signal from the ALIVE circuit in FIG. 12 to operate.

A VDCS circuit to which signal/ALIVE is input has a circuit structure as described below. Referring to FIG. 14, VDCS circuit 81B to which signal/ALIVE is input includes N channel MOS transistors 8118 and 8119 in addition to the components of VDCS circuit 81.

N channel MOS transistor 8118 receives, as its drive input, signal/ALIVE from ALIVE circuit 100 to operate. N channel MOS transistor 8119 receives, as its drive input, signal ACT for activating VDCS circuit 81B to operate. An operation is hereinafter described on the supposition that signal ACT is always in ON state and thus N channel MOS transistor 8119 is always in ON state.

Immediately after power-on, signal/ALIVE has H level so that N channel MOS transistor 8118 is turned on and an internal node 814 has its potential level relatively lower than that in a normal operation. Then, a driving circuit 812 supplies a greater amount of current from an external power supply node 816 to an internal power supply node 817 to promote charging of internal power supply node 817. In other words, VDCS circuit 81B operates to raise internal power supply potential int.VDD earlier.

Then, internal power supply potential int.VDD rises to cause signal/ALIVE to have L level and N channel MOS transistor 8118 to be turned off. Accordingly, the potential level of internal node 814 from a differential amplifier circuit 811 returns to a normal level.

According to the description above with reference to FIG. 14, signal/ALIVE is input to VDCS circuit 81 discussed in connection with the eighth embodiment. However, signal/ALIVE may be input to VDCS circuit 81A described in connection with the ninth embodiment, with a similar structure to that discussed above.

Further, although the VDCS circuit has been described above, a similar description is applied to the VDCP circuit. In this case, ALIVE circuit 100 is connected to any one of VDCP circuits 82 for the ×16-bit configuration that are arranged on the E/W band.

When VDCP circuits 82A are arranged on the E/W band, ALIVE circuit 100 may be connected to any one of VDCP circuits 82A.

It is noted that generally a plurality of VDCS circuits and a plurality of VDCP circuits are arranged and respective outputs of all VDCS circuits are connected together and respective outputs of all VDCP circuits are also connected together.

According to the tenth embodiment, ALIVE circuit 100 is connected to only any one of at least one VDCS circuit(s) 81 (or VDCS circuit(s) 81A) for the ×16-bit configuration arranged on the E/W band, and no ALIVE circuit is provided to VDCS circuit 83 (or VDCS circuit 83A) for the ×32-bit configuration arranged on the N/S band. Similarly, ALIVE circuit 100 is connected to only any one of at least one VDCP circuit(s) 82 (or VDCP circuit(s) 82A) for the ×16-bit configuration arranged on the E/W band, and no ALIVE circuit is provided to VDCP circuit 84 (or VDCP circuit 84A) for the ×32-bit configuration arranged on the N/S band.

As described above, according to the tenth embodiment, the semiconductor memory device has a minimum required number of ALIVE circuits 100. Then, the device can operate in its normal state as earlier as possible while power savings are possible. In addition, there is provided no unnecessary ALIVE circuit and accordingly the device size can be reduced.

Data Bus Structure

[Eleventh Embodiment]

According to an eleventh embodiment, an optimum data bus is structured according to pads arranged on the peripheral region. For comparison, FIG. 15 shows a data bus layout for a conventional arrangement of pads on the central region in a TSOP.

Figure 15:
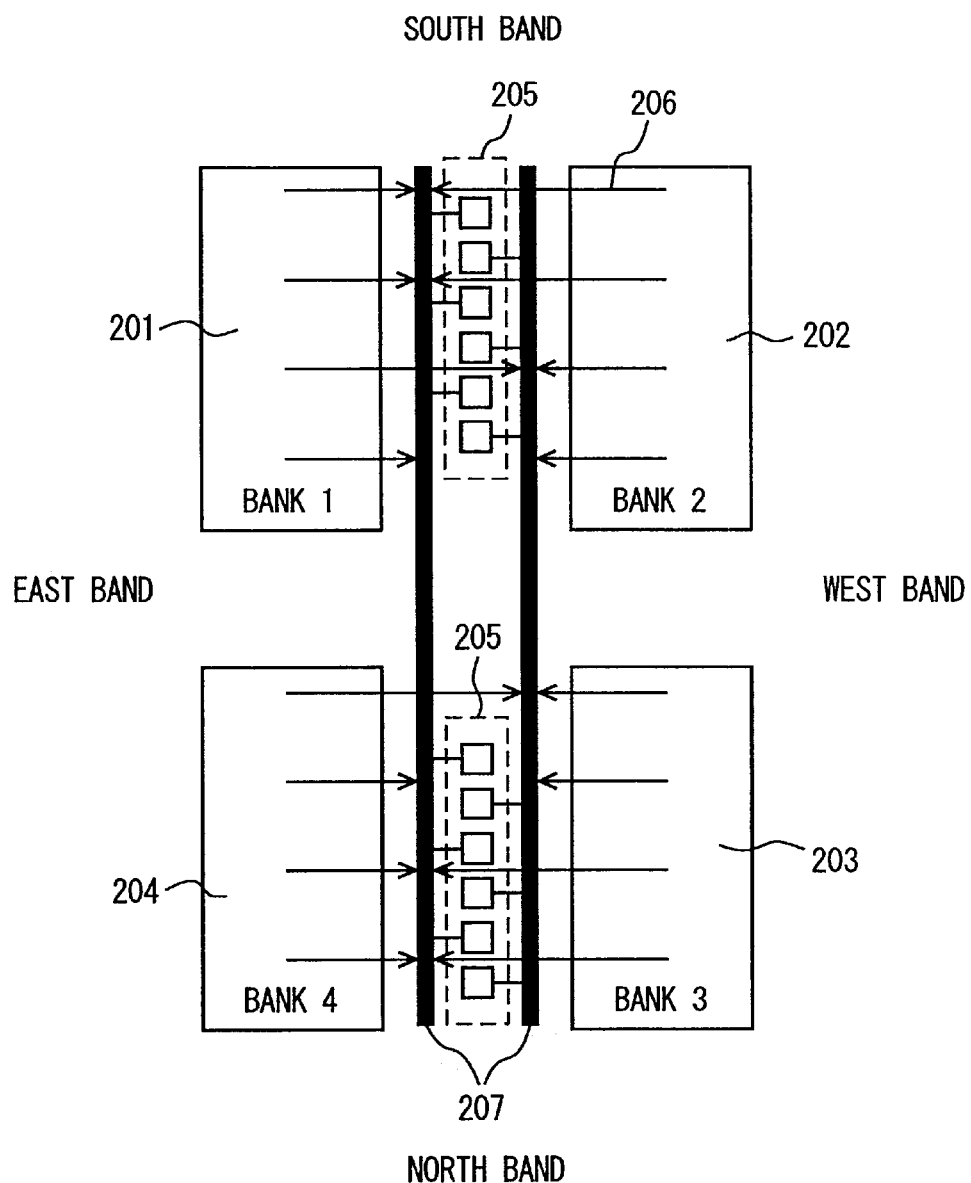
FIG. 15 shows a data bus layout for pads arranged on the central region.

FIG. 15 conceptually illustrates a semiconductor memory device for describing data transmission. The semiconductor memory device includes banks 201–204, DQ pads 205, local I/O lines 206, and a data bus 207.

Banks 201–204 are each a memory cell array including a plurality of memory cells.

Signals are provided to and from the semiconductor memory device through DQ pads 205.

Local I/O lines (hereinafter LIO lines) 206 are provided for transmitting data between banks 201–204 each and data bus 207. LIO lines 206 include all lines represented by arrows that connect each bank to data bus 207.

Data bus 207 extends over the semiconductor memory device.

When pads are arranged on the central region, DQ pads 205 are placed on the central region and input/output circuits (not shown) are placed near DQ pads 205. Accordingly, data read from banks 201–204 each via LIO lines 206 is output to the input/output circuits and DQ pads 205 via data bus 207 provided on the central region of the chip and connected to each of banks 201–204.

Figure 16:
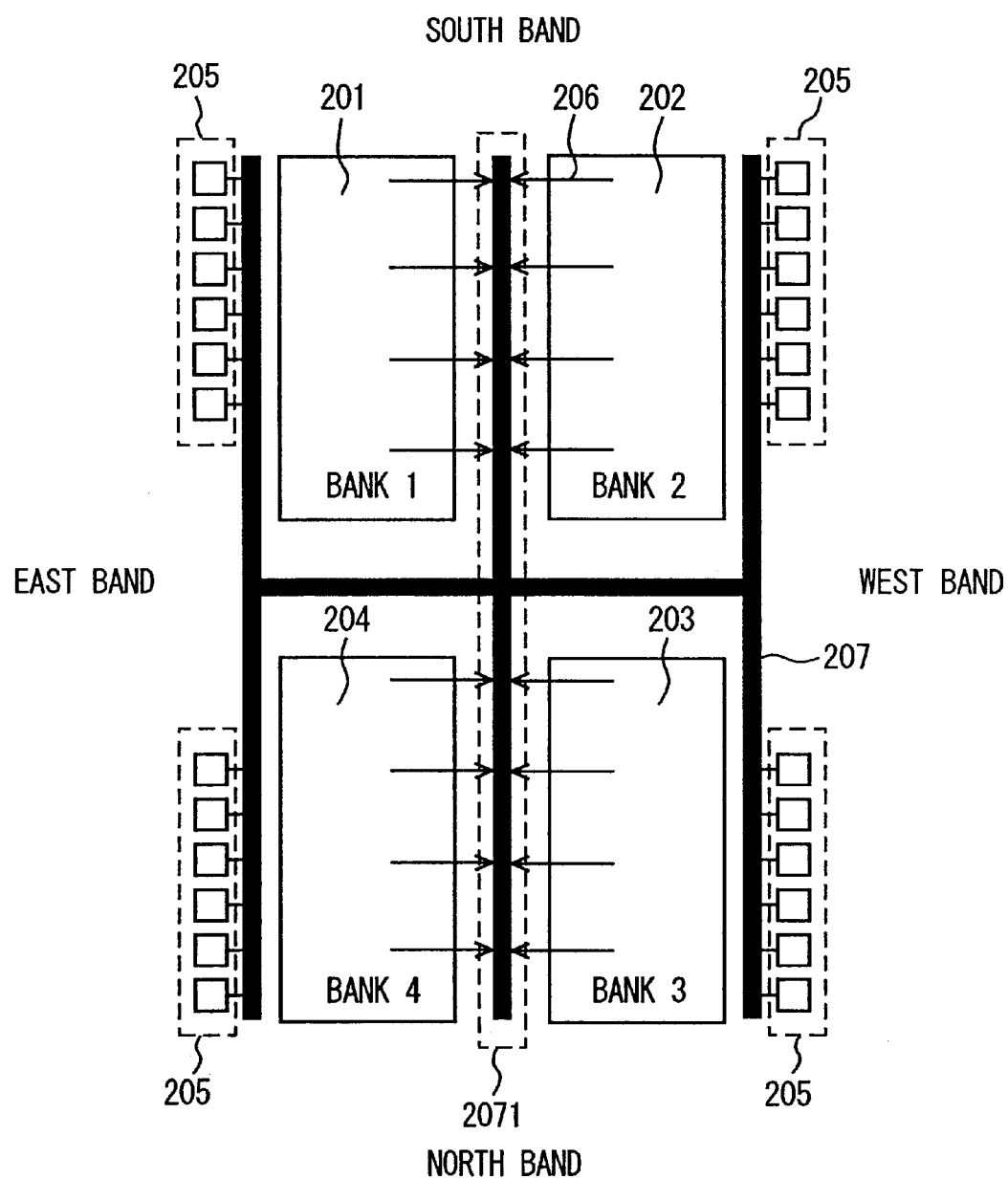
FIGS. 16 to 20 show respective data bus layouts of semiconductor memory devices according to eleventh to fifteenth embodiments of the present invention.

FIG. 16 shows a data bus layout according to the eleventh embodiment. According to pads arranged on the peripheral region, DQ pads 205 are placed on the E/W band. A data bus 207 is placed between banks and at the edge of the banks on the E/W band. Data is read from each bank to the central data bus indicated by reference numeral 2071.

When the pads are arranged on the peripheral region, DQ pads 205 are placed on the E/W band and input/output circuits (not shown) are placed near DQ pads 205. Therefore, data read from banks 201–204 each via LIO lines 26 should be transmitted to DQ pads 205 on the E/W band. Then, according to the eleventh embodiment, data is read from each bank onto central data bas 2071 and this data is transmitted to the input/output circuit and DQ pad on the E/W band through the region between banks. A signal for writing data is transmitted along the same route.

It is undesirable to turn each bank so that LIO lines 206 extend toward the outer end of the chip and thus data is read onto data bus 207 provided on the E/W band, since the longest route of data transmission is longer than that of the data bus layout shown in FIG. 16.

According to the eleventh embodiment described above, the optimum data bus structure for the pads arranged on the peripheral region is achieved. Thus, the semiconductor memory device is adaptable to various packages and deterioration thereof in its characteristics due to data transmission delay can be avoided.

[Twelfth Embodiment]

According to a twelfth embodiment, equalize circuits are provided respectively to several scattered parts of the data bus of the eleventh embodiment. The data bus is formed of complementary data lines (paired lines). Although the data bus structure of the eleventh embodiment is an optimum one for the pads arranged on the peripheral region, the longest data route is longer than that for the conventional arrangement of pads on the central region. In order to avoid data delay due to this, equalize circuits are arranged on several scattered parts of the data bus.

Figure 17:
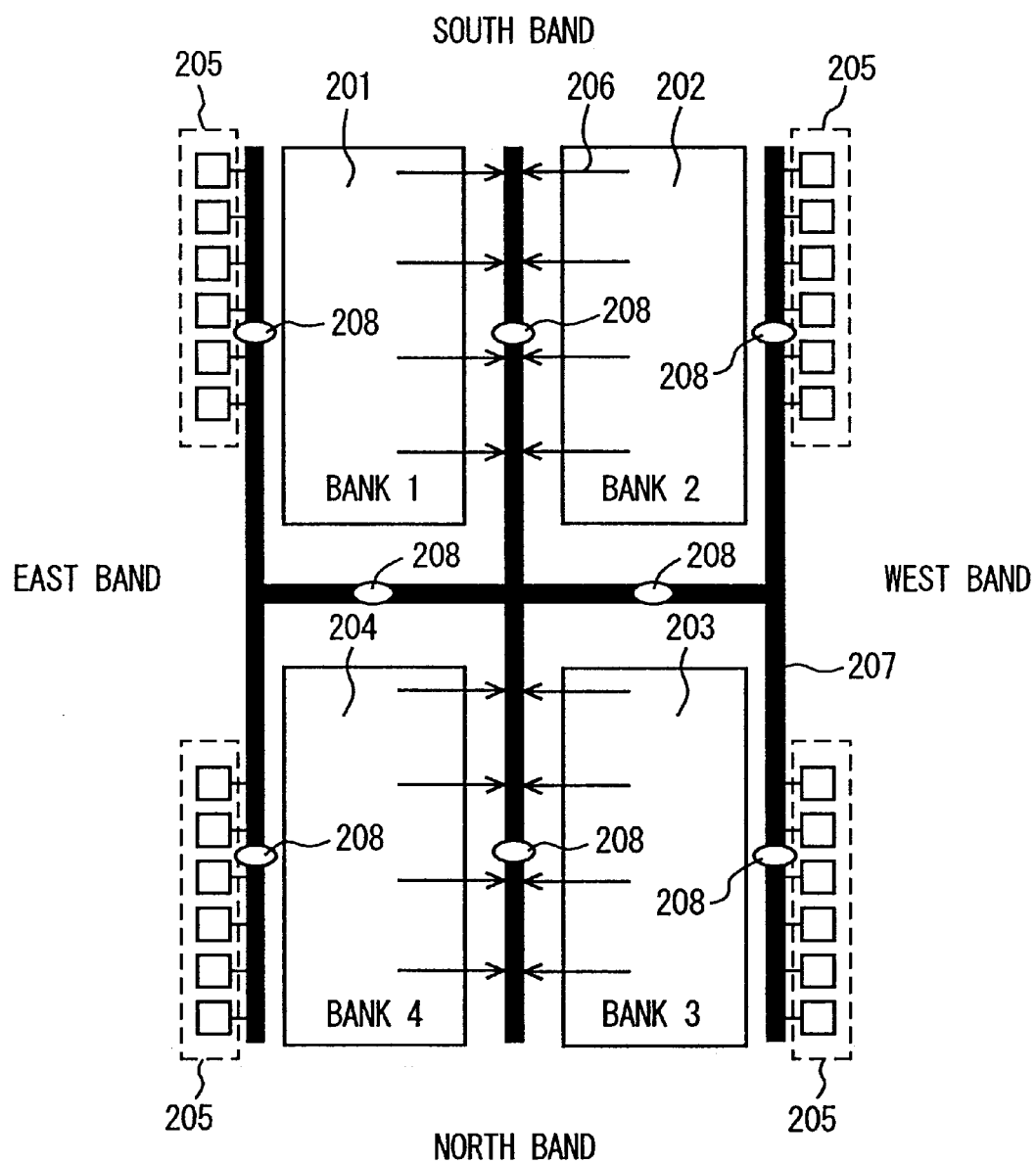

FIG. 17 shows an arrangement, as one example, of equalize circuits 208 on several scattered parts of data bus 207 shown in FIG. 16. Equalize circuits 208 are each an N channel MOS transistor connected between the paired lines constituting data bus 207, and the N channel transistor is turned on at a predetermined timing to equalize respective potential levels of the paired lines.

According to the twelfth embodiment, equalize circuits 208 are provided to several scattered parts of data bus 207 so as to prevent transmitted data from deteriorating.

[Thirteenth Embodiment]

Figure 18:
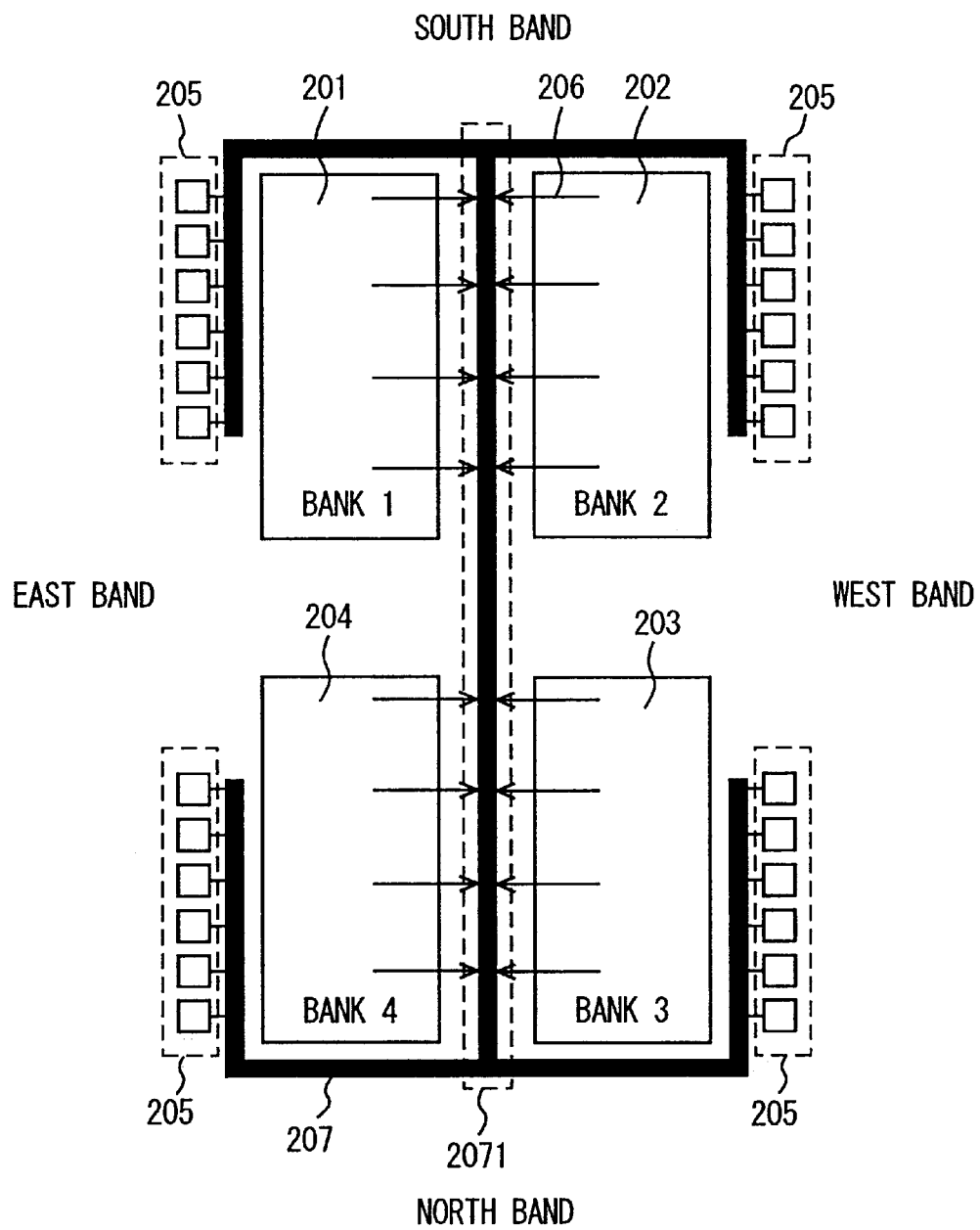

FIG. 18 shows a layout of a data bus 207 according to a thirteenth embodiment. According to the thirteenth embodiment, data bus 207 is placed on the N/S band for providing a route from a data bus 2071 provided on the central region to DQ pads 205 arranged on the E/W band. The longest route of data of the thirteenth embodiment is equal to that of the eleventh embodiment.

According to the thirteenth embodiment, an optimum data bus structure for the pads arranged on the peripheral region is achieved as done according to the eleventh embodiment. Therefore, the semiconductor memory device is adaptable to various packages and deterioration thereof in its characteristics due to data transmission delay can be avoided.

[Fourteenth Embodiment]

Figure 19:
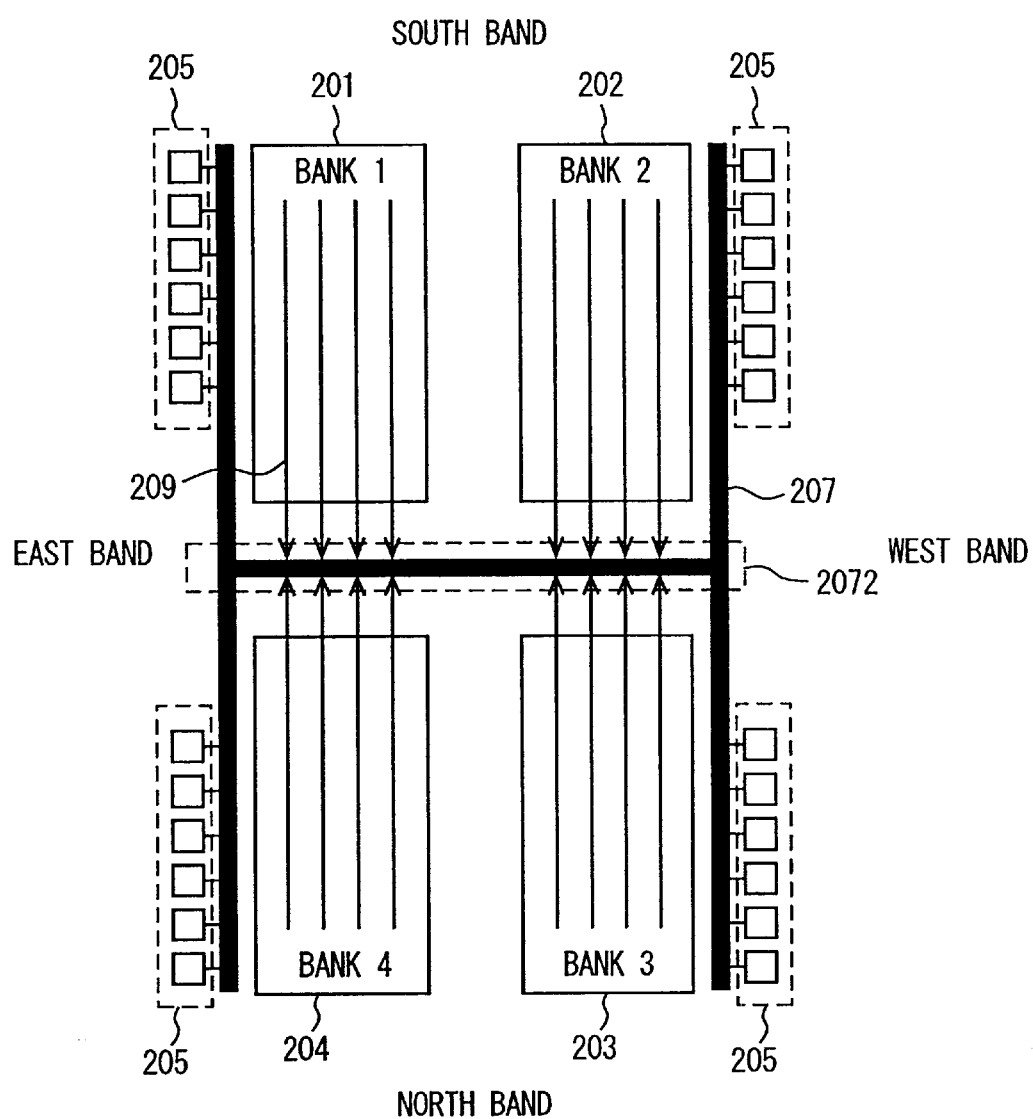

According to a fourteenth embodiment, an optimum data bus is structured for a memory cell array with a hierarchical I/O structure. FIG. 19 shows a layout of a data bus 207 according to the fourteenth embodiment. In the hierarchical I/O structure, data is input/output to/from each bank in parallel with the E/W band via global data lines 209 (including all lines represented by arrows connecting each bank and data bus 207 as shown in FIG. 19). Then, according to the fourteenth embodiment, data is read from each bank onto a central data bus 2072 and transmitted to input/output circuits and DQ pads provided on the E/W band.

The fourteenth embodiment provides, for the memory cell array with the hierarchical I/O structure, the optimum data bus structure when the pads are arranged on the peripheral region. Therefore, even if a semiconductor memory device has the hierarchical I/O structure, the semiconductor memory device is adaptable to various packages.

[Fifteenth Embodiment]

Figure 20:
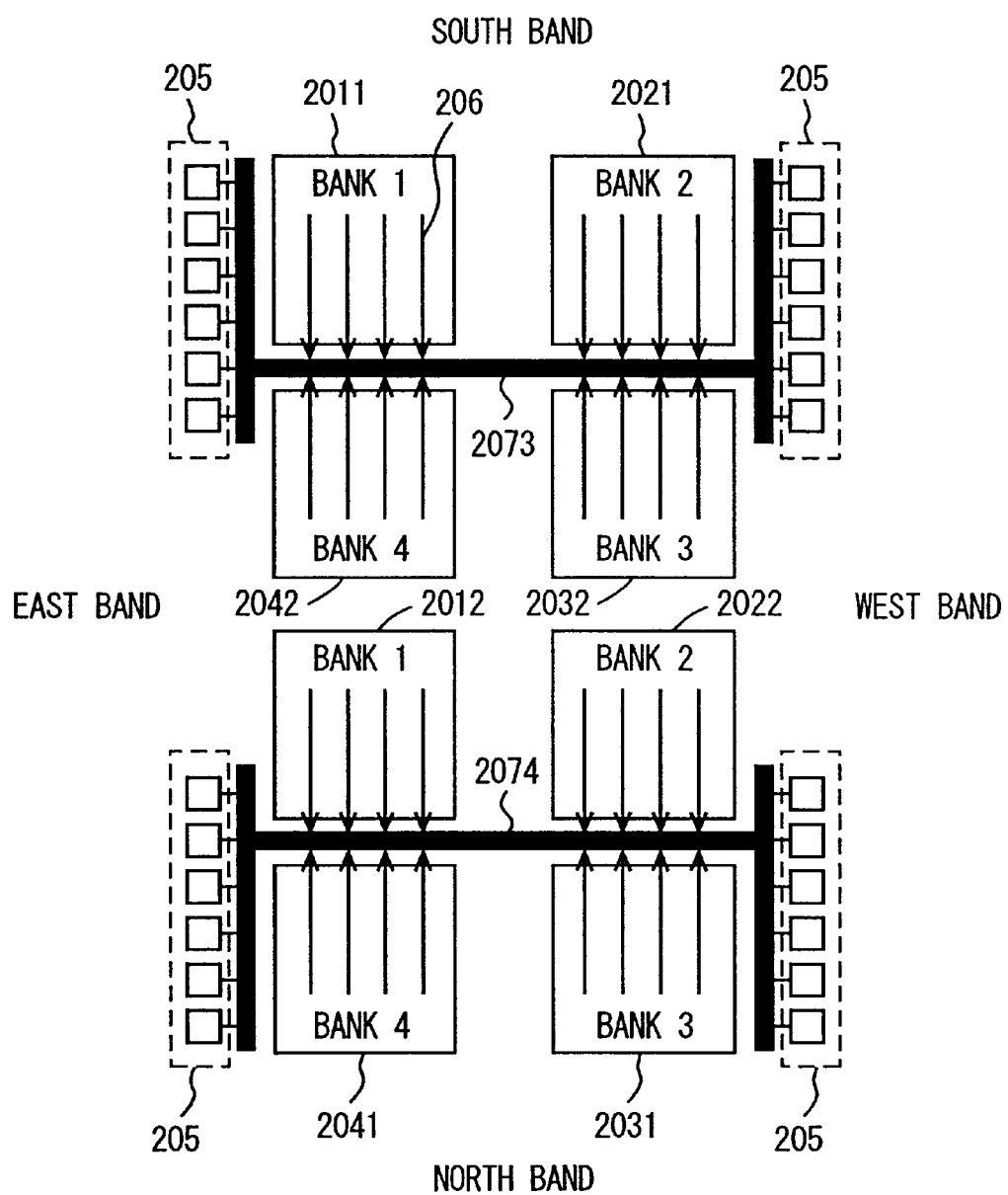

According to a fifteenth embodiment, each bank is divided and a data bas is provided between the resultant banks for the purpose of reducing the data bas length when the pads are arranged on the peripheral region. Referring to FIG. 20, banks 201–204 are divided respectively into two banks 2011 and 2012, 2021 and 2022, 2031 and 2032, and 2041 and 2042 arranged in the N/S direction. Then, respective positions of banks 2012 and 2042 are exchanged and respective positions of banks 2022 and 2032 are exchanged. Data buses 2073 and 2074 are arranged on respective spaces generated by dividing the banks, and data is transmitted between the data buses and banks each via LIO lines 206.

In this way, banks are divided as shown in FIG. 20 to considerably reduce the data bus length.

According to the fifteenth embodiment, banks are each divided and some of the resultant banks have respective positions exchanged, in order to avoid data transmission from the NORTH side to the SOUTH side.

Therefore, even if pads are arranged on the peripheral region, the data bus length can be reduced so that a semiconductor memory device is achieved that has characteristics prevented from deteriorating due to data transmission delay.

Placement of VDC Circuit

[Sixteenth Embodiment]

Figure 21:
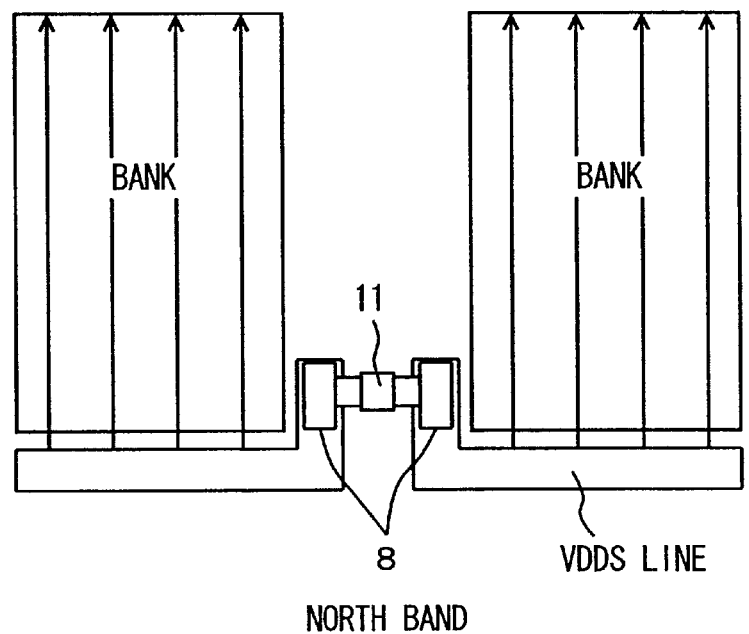
FIG. 21 shows a placement of a VDC circuit for pads arranged on the central region.

According to a sixteenth embodiment, the VDC circuit which is placed on the N/S band is placed under a VDDS line which is an internal power supply line provided on the peripheral region along the N/S band. For comparison, FIG. 21 shows a placement, as one example, of a VDC circuit when pads are arranged on the central region. In FIG. 21, only the NORTH side (similar to SOUTH side) of a semiconductor memory device is shown. The VDDS line which is an internal power supply line is provided along the edge of NORTH band and a VDD pad 11 and VDC circuit 8 are placed between banks.

Figure 22:
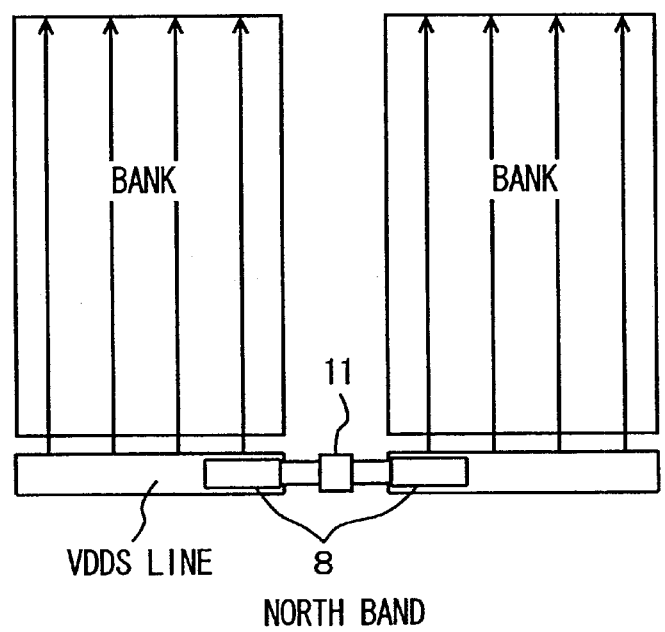
FIGS. 22 to 24 show respective placements of VDC circuits according to sixteenth to eighteenth embodiments of the present invention.

FIG. 22 shows a placement of VDC circuit 8 according to the sixteenth embodiment when pads are arranged on the peripheral region. In FIG. 22, as FIG. 21, only the NORTH side of a semiconductor memory device is shown. VDD pad 11 and VDC circuit 8 are placed not between banks but along the NORTH edge and VDC circuit 8 is placed under the VDDS line.

According to the sixteenth embodiment adapted to the arrangement of pads on the peripheral region, VDC circuit 8 is placed on the N/S band, not between banks, so that the space between the banks can be reduced and accordingly the chip can be downsized.

[Seventeenth Embodiment]

Figure 23:
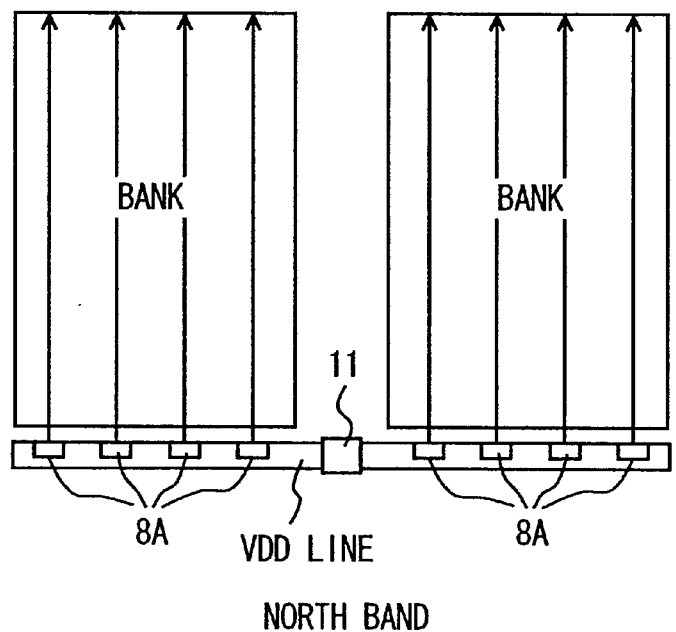

According to a seventeenth embodiment, small-sized VDC circuits are dispersedly arranged to further reduce the device size. Referring to FIG. 23, VDC circuits 8A of small size are employed and dispersedly arranged under a VDD line which is an external power supply line extending along the N/S band.

A driving circuit which is one of components constituting a VDC circuit has a relatively large structure while a differential amplifier circuit which is also one of the circuit components has a relatively small structure. Accordingly, only driving circuits of the VDC circuits may be dispersedly arranged while the differential amplifier circuit thereof may be arranged without being dispersed. In this case, the distance from the differential amplifier circuit to the driving circuit is longer and thus the issue of noise should be addressed.

Alternatively, one differential amplifier circuit may be provided per several driving circuits that are dispersedly arranged. If approximately one differential amplifier circuit is provided per two driving circuits, the distance between the differential amplifier circuit and driving circuit can be shortened and thus the resistance to noise does not deteriorate.

According to the seventeenth embodiment as described above, the device size can further be reduced by dispersedly arranging small-sized VDC circuits 8A along the N/S band.

[Eighteenth Embodiment]

According to an eighteenth embodiment, the device size is still further reduced by dispersedly arranging small-sized VDC circuits 8B on sense amplifier bands on a memory cell array.

Figure 24:
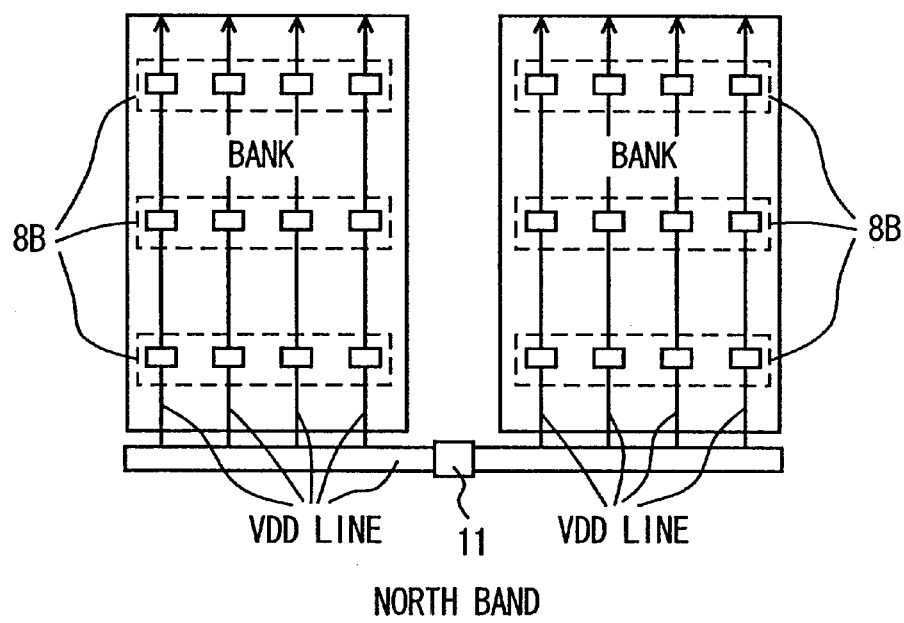

Referring to FIG. 24, VDC circuits 8B of small size are used and arranged dispersedly on sense amplifier bands on a memory cell array. A VDD line which is an external power supply line and placed on the N/S band branches to extend over the memory cell array. In general, the number of VDD lines is smaller than that of VDDS line which are internal power supply lines. Thus, if only one part of the VDD lines is broken, this breakage has a great influence on the circuitry.

In this regard, the eighteenth embodiment provides reinforcement of the VDD lines in consideration of the whole circuitry as compared with the conventional device.

As discussed above, according to the eighteenth embodiment, VDC circuits 8B are dispersedly provided on the sense amplifier bands. Therefore, no space for the VDC circuits is necessary on the N/S edge, which leads to a still further reduction in device size and further leads to reinforcement of the external power supply lines.

Voltage Mode Switching Circuit
[Nineteenth Embodiment]

A semiconductor memory device according to a nineteenth embodiment is adaptable to various packages. Moreover, the operating voltage can be switched so that the device of one chip is applicable to various manners of use.

According to the nineteenth embodiment, the operating supply voltage can be switched between 3.3 V as a normal voltage and 2.5 V as a lower voltage. In addition, regarding the interface specification, switching between a normal TTL interface specification and an 1.8 V interface specification is possible. This switching is accomplished by selecting any bonding option.

Figure 25:
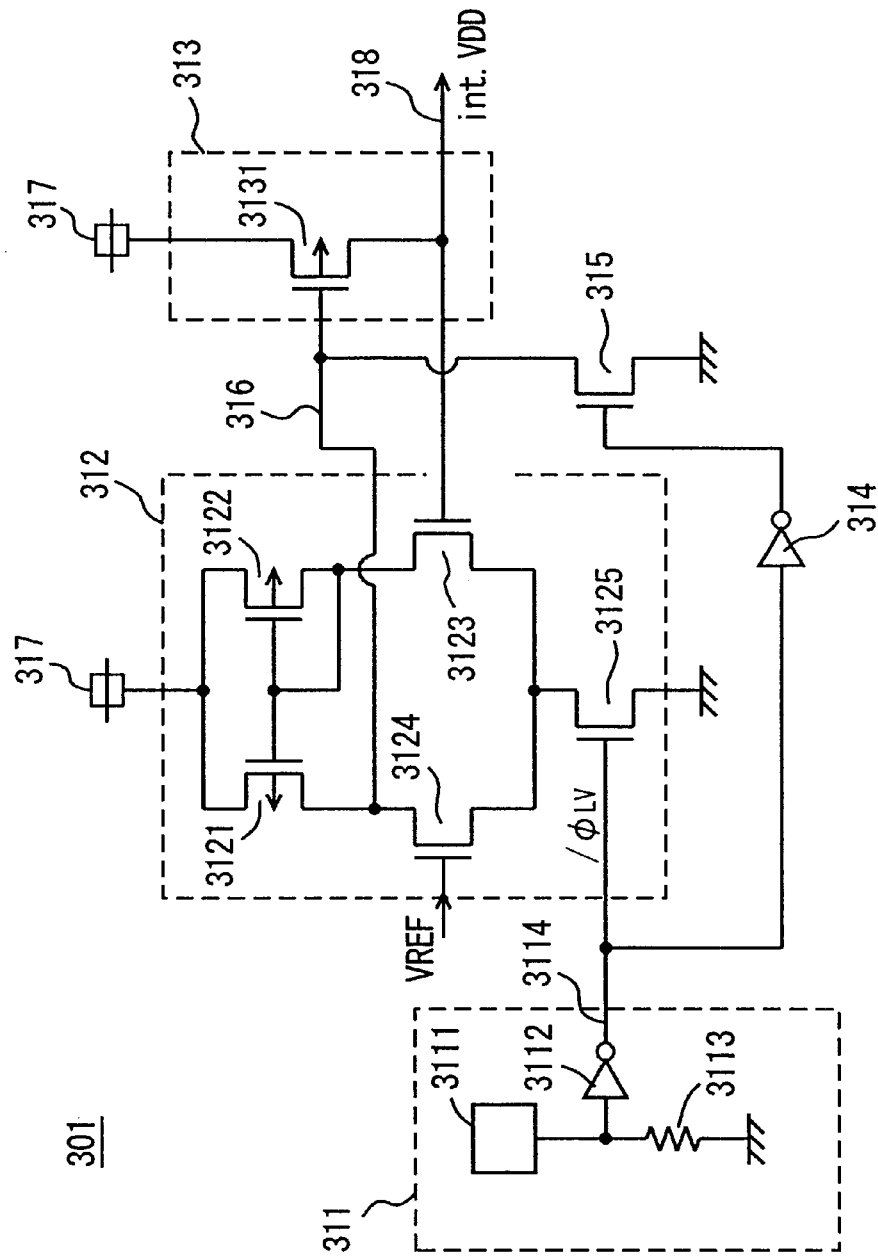
FIG. 25 is a circuit diagram of an operating voltage mode switching circuit according to the present invention.

FIG. 25 shows a circuit structure of an operating voltage mode switching circuit according to the nineteenth embodiment. Referring to FIG. 25, operating voltage mode switching circuit 301 includes a switch signal generating circuit 311, a differential amplifier circuit 312, a driving circuit 313, an inverter 314, an N channel MOS transistor 315, an internal node 316, an external power supply node 317, and an internal power supply node 318.

Switch signal generating circuit 311 is formed of a voltage selection pad 3111, an inverter 3112, a resistor 3113, and an output node 3114. Output signal /φLV is switched depending on whether voltage selection pad 3111 is wired to a VDD pad in an assembly process. In other words, if the operating supply voltage is 3.3 V, nothing is wired to voltage selection pad 3111 and switch signal generating circuit 311 outputs signal /φLV with H level to output node 3114. If the operating supply voltage is 2.5 V, voltage selection pad 3111 is wired to the VDD pad and switch signal generating circuit 311 outputs signal /φLV with L level to output node 3114.

Differential amplifier circuit 312 is formed of P channel MOS transistors 3121 and 3122 and N channel MOS transistors 3123–3125. N channel MOS transistor 3123 receives internal power supply potential int.VDD as its driving potential to operate. N channel MOS transistor 3124 receives reference potential VREF as its driving potential to operate. Reference potential VREF is a target potential of internal power supply potential int.VDD for the normal voltage and VREF can arbitrarily be set. N channel MOS transistor 3125 receives signal /φLV from switch signal generating circuit 311 as its driving potential.

When signal /φLV has H level, differential amplifier circuit 312 amplifies a potential difference between internal power supply potential int.VDD and reference potential VREF and outputs the amplified potential difference to internal node 316. Differential amplifier circuit 312 does not operated when signal /φLV has L level. When signal /φLV has L level, N channel MOS transistor 315 is turned on and internal node 316 has its potential level which is always at L level.

Driving circuit 313 is formed of a P channel MOS transistor 3131. P channel MOS transistor 3131 receives a potential on internal node 316 as its driving potential to operate. P channel MOS transistor 3131 is turned on when internal node 316 has L level to provide current from external power supply node 317 to internal power supply node 318. When internal node 316 has H level, P channel MOS transistor 3131 is turned off and provides no current to internal power supply node 318.

When a semiconductor memory device operates with 3.3 V, voltage selection pad 3111 is wired to nothing in an assembly process. Accordingly, switch signal generating circuit 311 outputs signal /φLV with H level. When signal /φLV has H level, differential amplifier circuit 312 amplifies a potential difference between internal power supply potential int.VDD and reference potential VREF and outputs the amplified potential difference to internal node 316. N channel MOS transistor 315 which is turned off does not affect the potential level of internal node 316. According to the potential level of internal node 316, driving circuit 313 turns on or off P channel MOS transistor 3131 to adjust current supplied from external power supply node 317 to internal power supply node 318. In this way, the voltage 3.3 V on external power supply node 317 is lowered to the level of reference potential VREF on internal power supply node 318.

When a semiconductor memory device operates with 2.5 V, voltage selection pad 311 is wired to the VDD pad in an assembly process. Then, switch signal generating circuit 3111 outputs signal /φLV with L level. When signal /φLV has L level, differential amplifier circuit 312 does not operate as N channel MOS transistor 3125 is turned off. On the other hand, N channel MOS transistor 315 is in ON state and internal node 316 is always at L level. P channel MOS transistor 3131 of driving circuit 313 is always in ON state and internal power supply potential int.VDD on internal power supply node 318 is 2.5 V equal to the external power supply voltage.

Figure 26:
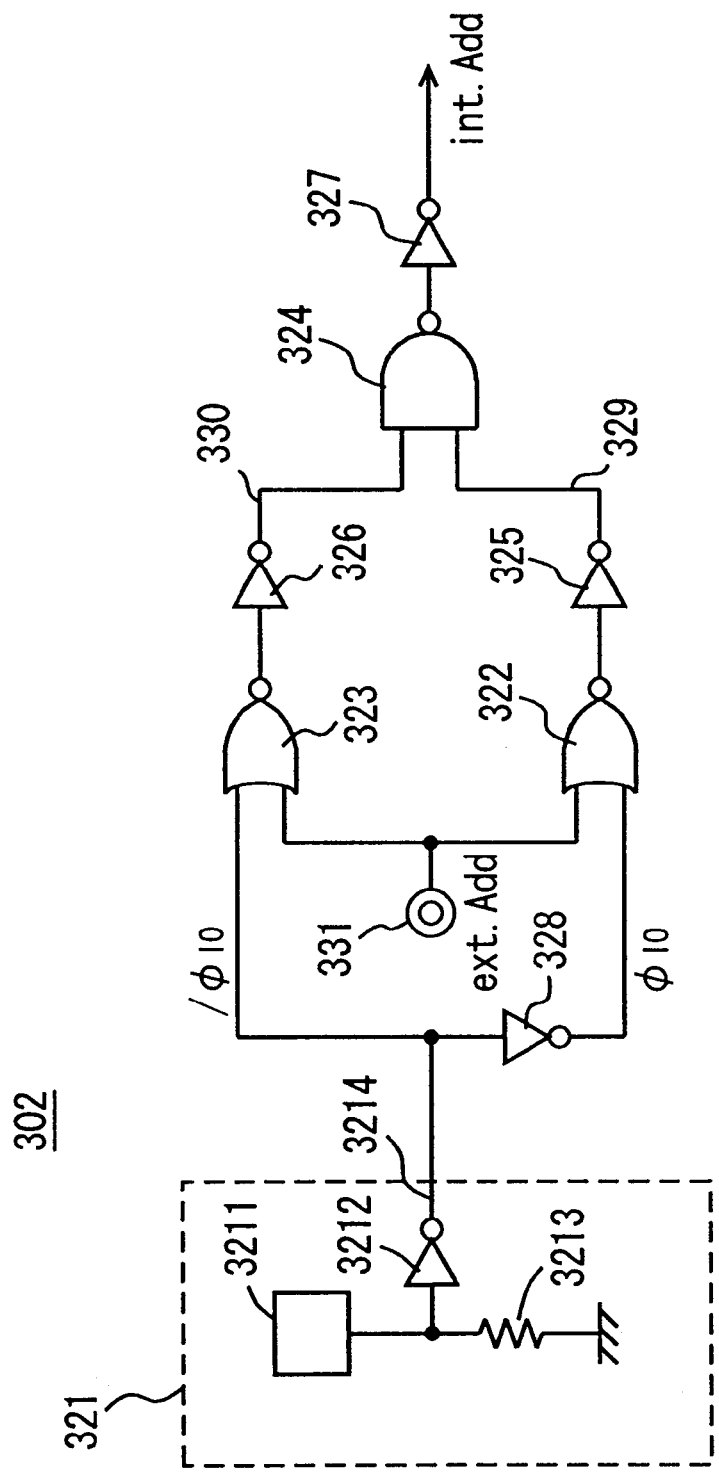
FIG. 26 is a circuit diagram of an interface voltage mode switching circuit according to the present invention.

FIG. 26 shows a circuit structure of an interface voltage mode switching circuit according to the nineteenth embodiment. Referring to FIG. 26, interface voltage mode switching circuit 302 includes a switch signal generating circuit 321, a TTL interface input circuit 322, an 1.8 V interface input circuit 323, a NAND circuit 324, and inverters 325–328.

Switch signal generating circuit 321 is formed of a voltage selection pad 3211, an inverter 3212, a resistor 3213, and an output node 3214.

Output signal /φIO is switched depending on whether voltage selection pad 3211 is wired to a VDD pad in an assembly process. In other words, when the TTL interface specification is employed, voltage selection pad 3211 is wired to nothing and thus switch signal generating circuit 321 provides output signal /φIO with H level to output node 3214. When the 1.8 V interface specification is employed, voltage selection pad 3211 is wired to the VDD pad and switch signal generating circuit 321 provides output signal /φIO with L level to output node 3214.

TTL interface input circuit 322 and 1.8 V interface input circuit 323 are NOR gates having different thresholds for input signals.

It is supposed here that output signal /φIO has H level. Then, node 330 is fixed at H level. Output signal φIO supplied to TTL interface input circuit 322 has L level. TTL interface input circuit 322 thus operates according to an external input signal (address signal ext.Add for example) provided from an external input terminal 331. The external input signal thus has its logic level determined according to the threshold of TTL interface input circuit 322 and is provided to the internal circuitry via NAND circuit 324 and inverter 327.

When output signal /φIO has L level, 1.8 V interface input circuit 323 operates according to an external input signal provided from external input terminal 331. Output signal φIO provided to TTL interface input circuit 322 has H level, and node 329 is fixed at H level. Thus, the external input signal has its logic level determined according to the threshold of 1.8V interface input circuit 323, and the signal is supplied to the internal circuitry via NAND circuit 324 and inverter 327.

As heretofore discussed, according to the nineteenth embodiment, a bonding option can be selected for switching the operating voltage and interface voltage specifications each. Therefore, products of different types can be manufactured in an assembly process, which facilitates production control.

[Twentieth Embodiment]

According to a twentieth embodiment, instead of switch signal generating circuits 311 and 321 of the nineteenth embodiment described above, switch signal generating circuits 311A and 321A are used respectively.

Switch signal generating circuits 311A and 321A have the same structure and the description below concerns switch signal generating circuit 311A.

Figure 27:
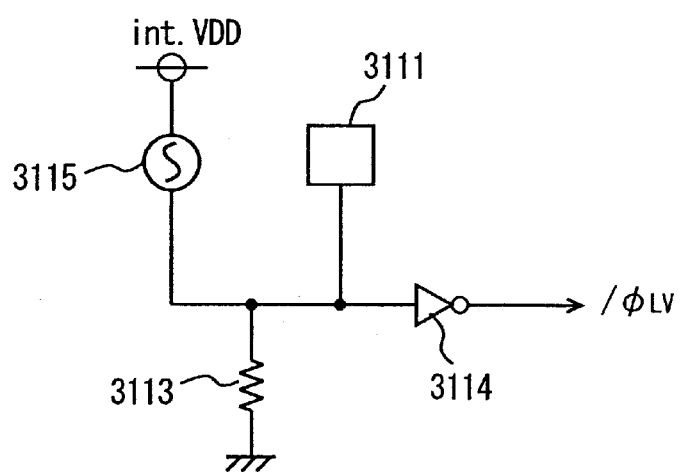
FIG. 27 is a circuit diagram of a switching signal generating circuit according to a twentieth embodiment of the present invention.

Switch signal generating circuit 311A includes both of a pad and fuse for generating a switch signal. Referring to FIG. 27, switch signal generating circuit 311A includes a fuse 3115 in addition to the components of switch signal generating circuit 311. Output signal /φLV is switched depending on whether or not voltage selection pad 3111 is wired to the VDD pad and whether or not fuse 3115 is laser-blown.

For a small-sized package like BGA package or for a high pin count which is employed for ×32-bit configuration, wiring to the pad could be difficult due to the space. In such a case, depending on whether fuse 3115 is laser-blown or not, output signal /φLV of switch signal generating circuit 311A can be switched.

Moreover, when both of the wiring and laser-blowing are possible and the laser-blowing is mistakenly done, the wiring can correct such an improper laser-blowing according to the twentieth embodiment.

According to the twentieth embodiment, two options, bonding option and laser-blowing option are available for switching product specification. Therefore, products of different types can surely be manufactured even if one of such options is unavailable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device rectangular in shape and adaptable to various types of packages, comprising:
    a memory element storing externally supplied data; and
    a plurality of bonding pads for conveying power supply, data and a signal to/from said memory element, wherein
        said plurality of bonding pads includes a first power supply pad and a first ground pad and other bonding pads except for said first power supply pad and said first ground pad,
        said first power supply pad and said first ground pad are placed near the center of each of two opposite sides of said semiconductor memory device, and
        said other bonding pads including a second power supply pad and a second ground pad are arranged on a peripheral region along remaining two sides other than said two opposite sides.

2. The semiconductor memory device according to claim 1, wherein when said semiconductor memory device is packaged by a TSOP, said first power supply pad is used by being wired to a lead of a leadframe that provides external power supply and said first ground pad is used by being wired to a lead of the leadframe that is grounded, and
    when said semiconductor memory device is packaged by a BGA package or multichip package, said second power supply pad is used by being wired to a lead of the leadframe that provides external power supply and said second ground pad is used by being wired to a lead of the leadframe that is grounded.

3. The semiconductor memory device according to claim 1, wherein
    said semiconductor memory device has its word structure switchable between a first word structure and a second word structure larger than said first word structure, and
    when said semiconductor memory device is used for said first word structure, said second power supply pad and said second ground pad are used by being wired respectively to a lead of a leadframe that provides external power supply and a lead of the leadframe that is grounded and
    when said semiconductor memory device is used for said second word structure, said first power supply pad and said first ground pad are used by being wired respectively to a lead of the leadframe that provides external power supply and a lead of the leadframe that is grounded.

4. The semiconductor memory device according to claim 3, wherein
    said second power supply pad and said second ground pad are each placed at an outermost end of a line of the bonding pads arranged along each of said remaining two sides.

5. The semiconductor memory device according to claim 1, further comprising:
    a first voltage downconverter circuit converting an external power supply potential provided from said first power supply pad to an internal power supply potential; and
    a second voltage downconverter circuit converting an external power supply potential provided from said second power supply pad to an internal power supply potential, wherein
        said first voltage downconverter circuit is placed near said first power supply pad and said first ground pad, and
        said second voltage downconverter circuit is placed near said second power supply pad and said second ground pad.

6. The semiconductor memory device according to claim 5, wherein
    said first voltage downconverter circuit is activated when said semiconductor memory device is packaged by a TSOP, and
    said second voltage downconverter circuit is activated when said semiconductor memory device is packaged by a BGA package or multichip package.

7. The semiconductor memory device according to claim 5, wherein
    said first voltage downconverter circuit and said second voltage downconverter circuit each include
        an internal power supply node providing the internal power supply potential to internal circuitry of said semiconductor memory device, an external power supply node provided with the external power supply potential and an internal power supply generating circuit converting said external power supply potential to said internal power supply potential and providing said internal power supply, potential to said internal power supply node, said semiconductor memory device has its word structure switchable between a first word structure and a second word structure larger than said first word structure, and when said semiconductor memory device is used for said first word structure, said internal power supply generating circuit reduces an amount of current provided from said external power supply node to said internal power supply node.

8. The semiconductor memory device according to claim 7, wherein said internal power supply generating circuit includes a differential amplifier circuit amplifying a potential difference between said internal power supply potential and a reference potential which is a target potential of said internal power supply potential and outputting a potential level corresponding to the amplified potential difference, a driving circuit providing current from said external power supply node to said internal power supply node via a plurality of nodes according to the potential level output from said differential amplifier circuit, and a switching circuit changing ability of said driving circuit by cutting off current through at least one of said plurality of nodes to reduce current provided by said driving circuit to said internal power supply node when said semiconductor memory device is used for said first word structure.

9. The semiconductor memory device according to claim 7, wherein said internal power supply generating circuit includes a differential amplifier circuit amplifying a potential difference between said internal power supply potential and a reference potential which is a target potential of said internal power supply potential and outputting a potential level corresponding to the amplified potential difference, a driving circuit providing current from said external power supply node to said internal power supply node according to the potential level output from said differential amplifier circuit, and a switching circuit changing ability of said differential amplifier circuit by raising the potential level output from said differential amplifier circuit to reduce current provided by said driving circuit to said internal power supply node when said semiconductor memory device is used for said first word structure.

10. The semiconductor memory device according to claim 7, further comprising a power-on circuit generating, after external power supply is provided, an activation signal until said internal power supply potential reaches a predetermined potential, wherein said semiconductor memory device includes at least one second voltage downconverter circuit, said power-on circuit is connected to at least one of said second voltage downconverter circuits, and said second voltage downconverter circuit connected to said power-on circuit increases, according to said activation signal provided from said power-on circuit, an amount of current provided from said external power supply node to said internal power supply node.

11. The semiconductor memory device according to claim 5, wherein said first voltage downconverter circuit provides power supply for a memory cell array and is placed under an internal power supply line placed along the outer periphery of said semiconductor memory device.

12. The semiconductor memory device according to claim 1, wherein a plurality of bonding pads placed on each end of a line of the bonding pads arranged along each of said remaining two sides are arranged in reverse order relative to an order of pins of a package in which said semiconductor memory device is encapsulated.

13. The semiconductor memory device according to claim 12, wherein the line of the bonding pads arranged along each of said remaining two sides includes at least one pair of a third power supply pad and a third ground pad used for a first word structure and at least one pair of a fourth power supply pad and a fourth ground pad used for a second word structure larger than said first word structure, the pair of said third power supply pad and said third ground pad and the pair of said fourth power supply pad and said fourth ground pad are each placed on said end of the line of the bonding pads arranged along each of said remaining two sides, said third power supply pad and said third ground pad are arranged in the same order as the order of pins of the package in which said semiconductor memory device is encapsulated, and said fourth power supply pad and said fourth ground pad are arranged in reverse order relative to the order of pins of the package in which said semiconductor memory device is encapsulated.

14. The semiconductor memory device according to claim 1, wherein said memory element includes a memory cell array having a plurality of memory cells, an input/output circuit connected to a data input/output pad included in said bonding pads for input/output of data from/to external circuitry, and a data bus for transmitting data between said memory cell array and said input/output circuit, said memory cell array is formed of four banks arranged respectively in four regions of said semiconductor memory device, said four regions corresponding to respective regions generated by dividing said semiconductor memory device along a vertical central line and a horizontal central line, said input/output circuit is placed on the peripheral region along said remaining two sides where a line of said bonding pads is placed, said data bus is placed between said banks and along said remaining two sides, and said banks are each connected to said data bus placed on a central region between said banks and extending in parallel with said remaining two sides.

15. The semiconductor memory device according to claim 14, further comprising an equalize circuit setting potential on said data bus at a predetermined potential for a predetermined period, wherein at least one said equalize circuit is placed on a data path along said data bus connecting said input/output circuit and each of said banks.

16. The semiconductor memory device according to claim 1, wherein
said memory element includes
a memory cell array having a plurality of memory cells,
an input/output circuit connected to a data input/output pad included in said bonding pads for input/output of data from/to external circuitry, and
a data bus for transmitting data between said memory cell array and said input/output circuit,
said memory cell array is formed of four banks arranged respectively in four regions of said semiconductor memory device, said four regions corresponding to respective regions generated by dividing said semiconductor memory device along a vertical central line and a horizontal central line,
said input/output circuit is placed on the peripheral region along said remaining two sides where a line of said bonding pads is placed,
said data bus is placed along a central line which is in parallel with said remaining two sides of said semiconductor memory device and along said two sides and said remaining two sides, and
said banks are each connected to said data bus placed between said banks and extending in parallel with said remaining two sides.

17. The semiconductor memory device according to claim 1, wherein
said memory element includes
a memory cell array having a plurality of memory cells,
an input/output circuit connected to a data input/output pad included in said bonding pads for input/output of data from/to external circuitry, and
a data bus for transmitting data between said memory cell array and said input/output circuit,
said memory cell array has a hierarchical I/O structure and is formed of four banks arranged respectively in four regions of said semiconductor memory device, said four regions corresponding to respective regions generated by dividing said semiconductor memory device along a vertical central line and a horizontal central line,
said input/output circuit is placed on the peripheral region along said remaining two sides where a line of said bonding pads is placed,
said data bus is placed along a central line which is in parallel with said two sides of said semiconductor memory device and along said remaining two sides, and
said banks are each connected to said data bus placed between said banks and extending in parallel with said two sides.

18. The semiconductor memory device according to claim 1, wherein
said memory element includes
a memory cell array having a plurality of memory cells and
voltage downconverter circuits converting an external power supply potential provided from said first power supply pad to an internal power supply potential for providing power supply to said memory cell array, wherein
said voltage downconverter circuits are each small in size and placed on each sense amplifier band on said memory cell array, and
said external power supply potential is provided from said first power supply pad through a first external power supply line connected to said first power supply pad and placed along each of said two sides and through a plurality of second power supply lines connected to said first external power supply line and placed on said memory cell array.

19. A semiconductor memory device having a switchable internal power supply voltage and a switchable interface voltage, comprising:
a first switch signal generating circuit generating a first switch signal for switching said internal power supply voltage;
a second switch signal generating circuit generating a second switch signal for switching said interface voltage;
an internal power supply generating circuit converting, according to said first switch signal, an external power supply voltage to a predetermined internal power supply voltage and outputting the predetermined internal power supply voltage to an internal power supply node; and
an input circuit changing, according to said second switch signal, a threshold of voltage determining a logic level of an external input signal,
said first switch signal generating circuit including a first bonding pad and generating said first switch signal according to whether or not a wire provided with a predetermined potential is connected to said first bonding pad, and
said second switch signal generating circuit including a second bonding pad and generating said second switch signal according to whether or not a wire provided with a predetermined potential is connected to said second bonding pad.

20. The semiconductor memory device according to claim 19, wherein
said first switch signal generating circuit further includes a first fuse connected to a node coupled to said first bonding pad and connected to the internal power supply node,
said first switch signal generating circuit generates said first switch signal according to whether or not said first fuse is laser-blown, and generates, when said first fuse is mistakenly blown, said first switch signal according to whether or not a wire provided with a predetermined potential is connected to said first bonding pad,
said second switch signal generating circuit further includes a second fuse connected to a node coupled to said second bonding pad and connected to the internal power supply node,
said second switch signal generating circuit generates said second switch signal according to whether or not said second fuse is laser-blown, and generates, when said second fuse is mistakenly blown, said second switch signal according to whether or not a wire provided with a predetermined potential is connected to said second bonding pad.

* * * * *